United States Patent
Lee et al.

(10) Patent No.: US 11,315,946 B2
(45) Date of Patent: Apr. 26, 2022

(54) VERTICAL SEMICONDUCTOR DEVICE AND METHOD OF FABRICATING THE SAME

(71) Applicant: SAMSUNG ELECTRONICS CO., LTD., Suwon-si (KR)

(72) Inventors: Bongyong Lee, Suwon-si (KR); Taehun Kim, Gwacheon-si (KR); Minkyung Bae, Hwaseong-si (KR); Myunghun Woo, Suwon-si (KR); Doohee Hwang, Uiwang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 75 days.

(21) Appl. No.: 16/838,106

(22) Filed: Apr. 2, 2020

(65) Prior Publication Data

US 2020/0395379 A1 Dec. 17, 2020

(30) Foreign Application Priority Data

Jun. 11, 2019 (KR) .................. 10-2019-0068800

(51) Int. Cl.
| | |
|---|---|
| *H01L 27/11582* | (2017.01) |
| *H01L 27/11556* | (2017.01) |
| *H01L 27/11573* | (2017.01) |
| *H01L 27/11529* | (2017.01) |
| *H01L 27/1157* | (2017.01) |
| *H01L 27/11524* | (2017.01) |

(52) U.S. Cl.
CPC .... *H01L 27/11582* (2013.01); *H01L 27/1157* (2013.01); *H01L 27/11524* (2013.01); *H01L 27/11529* (2013.01); *H01L 27/11556* (2013.01); *H01L 27/11573* (2013.01)

(58) Field of Classification Search
None
See application file for complete search history.

(56) References Cited

U.S. PATENT DOCUMENTS

| | | | |
|---|---|---|---|
| 9,355,727 | B1 | 3/2016 | Zhang et al. |
| 9,978,771 | B2 | 5/2018 | Hwang |
| 9,985,098 | B2 | 5/2018 | Matsumoto et al. |
| 9,997,534 | B2 | 6/2018 | Son et al. |
| 10,062,707 | B2 | 8/2018 | Lee |
| 2015/0102346 | A1* | 4/2015 | Shin ............... H01L 27/11582 257/66 |
| 2015/0200203 | A1* | 7/2015 | Jang ............... H01L 27/11582 257/324 |
| 2018/0323213 | A1 | 11/2018 | Arai |
| 2018/0366488 | A1 | 12/2018 | Choi et al. |

(Continued)

*Primary Examiner* — Hsien Ming Lee
(74) *Attorney, Agent, or Firm* — Lee IP Law, P.C.

(57) ABSTRACT

A vertical semiconductor layer includes a common source semiconductor layer on a substrate, a support layer on the common source semiconductor layer, gates and interlayer insulating layers alternately stacked on the support layer, a channel pattern extending in a first direction perpendicular to an upper surface of the substrate while penetrating the gates and the support layer, a sidewall of the support layer facing the channel pattern being offset relative to sidewalls of the gates facing the channel pattern, and an information storage layer extending between the gates and the channel pattern, the information storage layer extending at least to the sidewall of the support layer facing the channel pattern.

16 Claims, 36 Drawing Sheets

(56) References Cited

U.S. PATENT DOCUMENTS

2019/0139980 A1* 5/2019 Kim ................... G11C 16/0483
2020/0168622 A1* 5/2020 Fukuzumi ......... H01L 27/11565
2020/0395367 A1* 12/2020 Son ................... H01L 27/11578

* cited by examiner

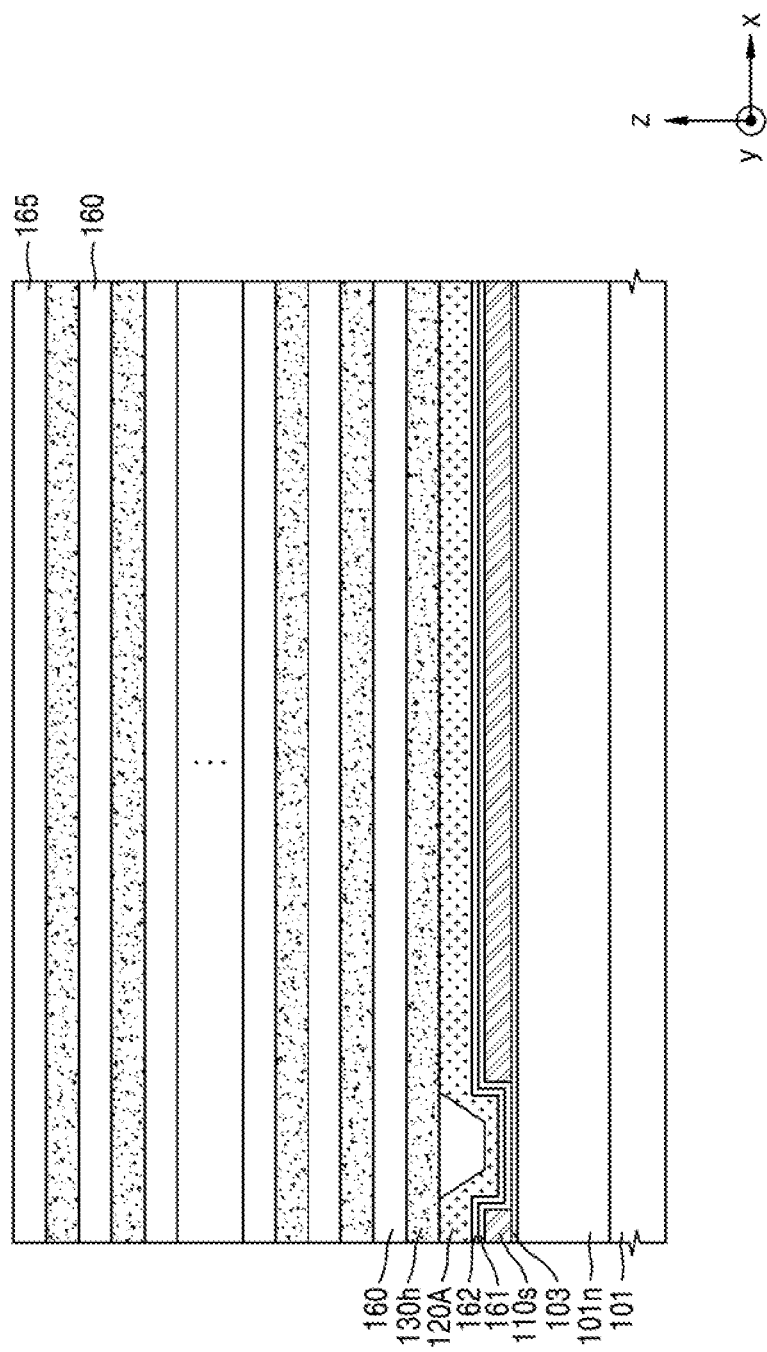

VERTICAL SEMICONDUCTOR DEVICE AND METHOD OF FABRICATING THE SAME

CROSS-REFERENCE TO RELATED APPLICATION

Korean Patent Application No. 10-2019-0068800, filed on Jun. 11, 2019, in the Korean Intellectual Property Office, and entitled: "Vertical Semiconductor Device and Method of Fabricating the Same," is incorporated by reference herein in its entirety.

BACKGROUND

1. Field

Example embodiments relate to a vertical semiconductor device and a method of fabricating the same, and more particularly, to a vertical semiconductor device having excellent electrical characteristics and high reliability and a method of fabricating the same.

2. Description of the Related Art

In a vertical semiconductor device formed on an n-well, an erase operation of a memory cell may be performed by using a gate induced drain leakage (GIDL) method using a GIDL phenomenon. In this case, there is still room for improvement in the dispersion control of the electrical characteristics of devices.

SUMMARY

According to an aspect of embodiments, there is provided a vertical semiconductor layer including a common source semiconductor layer on a substrate, a support layer on the common source semiconductor layer, gates and interlayer insulating layers alternately stacked on the support layer, a channel pattern extending in a first direction perpendicular to an upper surface of the substrate while penetrating the gates and the support layer, a sidewall of the support layer facing the channel pattern being offset relative to sidewalls of the gates facing the channel pattern, and an information storage layer extending between the gates and the channel pattern, the information storage layer extending at least to the sidewall of the support layer facing the channel pattern.

According to another aspect of embodiments, there is provided a vertical semiconductor layer including a common source semiconductor layer on an n-well of a substrate, a support layer on the common source semiconductor layer, gates and interlayer insulating layers alternately stacked on the support layer, a channel pattern extending in a first direction perpendicular to an upper surface of the substrate while penetrating the gates and the support layer, the channel pattern including a channel pattern extension portion protruding toward the support layer in a lateral direction of the support layer, and a sidewall of the support layer facing the channel pattern being offset relative to sidewalls of the gates facing the channel pattern, and an information storage layer extending between the gates and the channel pattern.

According to another aspect of embodiments, there is provided a vertical semiconductor layer, including a common source semiconductor layer on an n-well of a substrate having a p-conductivity type, a support layer on the common source semiconductor layer, gates and interlayer insulating layers alternately stacked on the support layer, a channel pattern extending in a first direction perpendicular to an upper surface of the substrate while penetrating the gates and the support layer, the channel pattern extending through a channel hole, and the support layer being in direct contact with a lowermost gate of the gates in the channel hole, and an information storage layer extending between the gates and the channel pattern, wherein a sidewall of the support layer facing the channel hole is offset relative to sidewalls of the gates facing the channel hole, and wherein the information storage layer extends horizontally toward the support layer along a lower surface of the lowermost gate of the gates and then extends in the first direction along the sidewall of the support layer.

According to another aspect of embodiments, there is provided a method of fabricating a vertical semiconductor device, the method including forming a lower sacrificial layer pattern on an n-well of a substrate having a p-conductivity type, forming a support layer on the lower sacrificial layer pattern, alternately stacking a sacrificial layer and an insulating layer on the support layer, forming a channel hole penetrating the sacrificial layer, the insulating layer, the support layer, and a lower sacrificial layer, partially removing an exposed sidewall of the support layer in the channel hole, forming an information storage material layer and a channel pattern in the channel hole, replacing the lower sacrificial layer with a common source semiconductor layer, and replacing the sacrificial layer with gates.

BRIEF DESCRIPTION OF THE DRAWINGS

Features will become apparent to those of skill in the art by describing in detail exemplary embodiments with reference to the attached drawings, in which:

FIGS. 7A to 7I illustrate lateral cross-sectional views of stages in a method of fabricating a semiconductor device, according to an embodiment;

DETAILED DESCRIPTION

Hereinafter, example embodiments will be described in detail with reference to the accompanying drawings.

Figure 1:
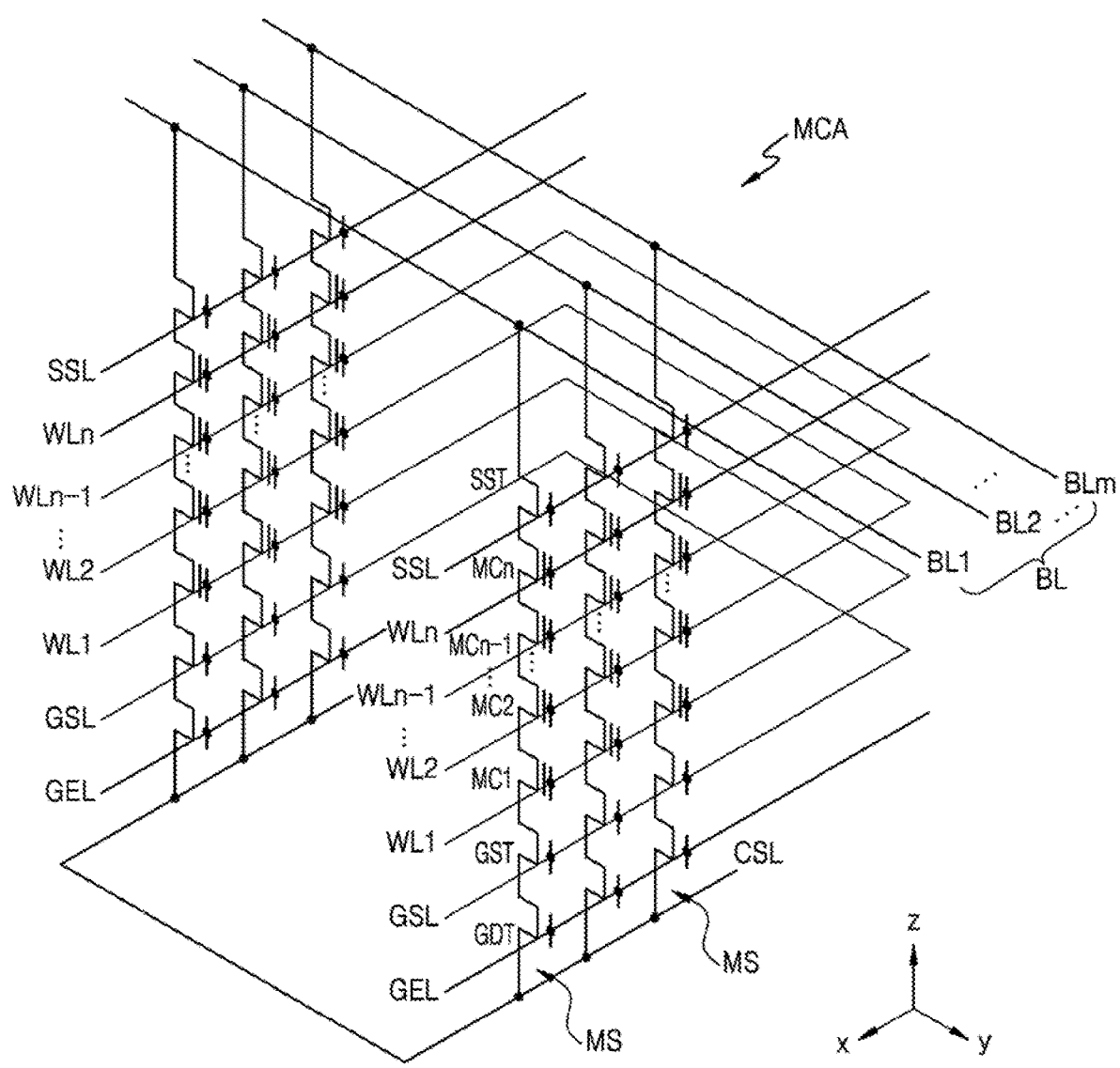
FIG. 1 illustrates an equivalent circuit diagram of a memory cell array of a semiconductor device according to embodiments.

FIG. 1 is an equivalent circuit diagram of a memory cell array MCA of a semiconductor device. In particular, FIG. 1 illustrates an equivalent circuit diagram of a vertical NAND (VNAND) flash memory device having a vertical channel structure according to embodiments.

Referring to FIG. 1, the memory cell array MCA may include a plurality of memory cell strings MS including a plurality of memory cells MC1, MC2, . . . , MCn−1, MCn arranged in a vertical direction (z-direction in FIG. 1) on a substrate. Each of the plurality of memory cell strings MS may include the plurality of memory cells MC1, MC2, . . . , MCn−1, MCn connected in series, a string selection transistor SST, a ground selection transistor GST, and a gate induced drain leakage (GIDL) transistor GDT. The plurality of memory cells MC1, MC2, . . . , MCn−1, MCn may store data, and a plurality of word lines WL1, WL2, . . . , WLn−MCn−1, and MCn may be respectively connected to the memory cells MC1, MC2, . . . , MCn−1, MCn to control the memory cells MC1, MC2, . . . , MCn−1, MCn.

A gate terminal of the ground selection transistor GST may be connected to the ground selection line GSL, and a source terminal of the ground selection transistor GST may be connected to a source terminal of the GIDL transistor GDT, and a source terminal of the GIDL transistor GDT may be connected to the common source line CSL. A gate terminal of the string selection transistor SST may be connected to the string selection line SSL, and a source terminal of the string selection transistor SST may be connected to a drain terminal of the memory cell MCn, and a drain terminal of the string selection transistor SST may be connected to a plurality of bit lines BL1, BL2, . . . , BLm: BL. Although FIG. 1 illustrates an example that each memory cell string MS includes one ground selection transistor GST, one string selection transistor SST, and one GIDL transistor GDT, two or more ground selection transistors GST, two or more string selection transistors SST, and/or two or more GIDL transistors GDT may be included in each memory cell string MS.

When a signal is applied to the gate terminal of the string selection transistor SST through the string selection line SSL, a signal applied through the plurality of bit lines BL may be provided to the plurality of memory cells MC1, MC2, . . . , MCn−1, MCn and thus a data write operation may be performed. When a signal is applied to the gate terminal of the ground selection transistor GST through the ground selection line GSL, an erase operation of the plurality of memory cells MC1, MC2, . . . , MCn−1, MCn may be performed.

According to embodiments, a common source semiconductor layer 110 (see FIG. 2) having an n-type conductivity type may be provided between the ground selection line GSL and the common source line CSL, and thus, an erase operation of the memory cell array MCA may be performed by using a GIDL method. For example, an erase voltage Ver may be applied to the common source line CSL and a reference voltage Vref may be applied to a GIDL erase line GEL connected to a gate of the GIDL transistor GDT. At this time, due to a potential difference between the erase voltage Ver and the reference voltage Vref, a high electric field may be generated in the common source semiconductor layer 110 adjacent to the GIDL erase line GEL and may generate electrons and holes in the common source semiconductor layer 110. Holes generated in the common source semiconductor layer 110 may be injected into the memory cell string MS such that the erase operation of the plurality of memory cells MC1, MC2, . . . , MCn−1, MCn may be performed.

The semiconductor device of the related art uses an erase method using a substrate body and performs an erase operation of a plurality of memory cells by directly injecting holes from a substrate into a memory cell string electrically connected to the substrate. However, it has been necessary to form a lower substructure by a complicated process in order to provide an injection path of the holes from the substrate to the memory cell string. However, the semiconductor device according to embodiments may implement an erase operation by using the GIDL method through a simplified structure.

Figure 2:
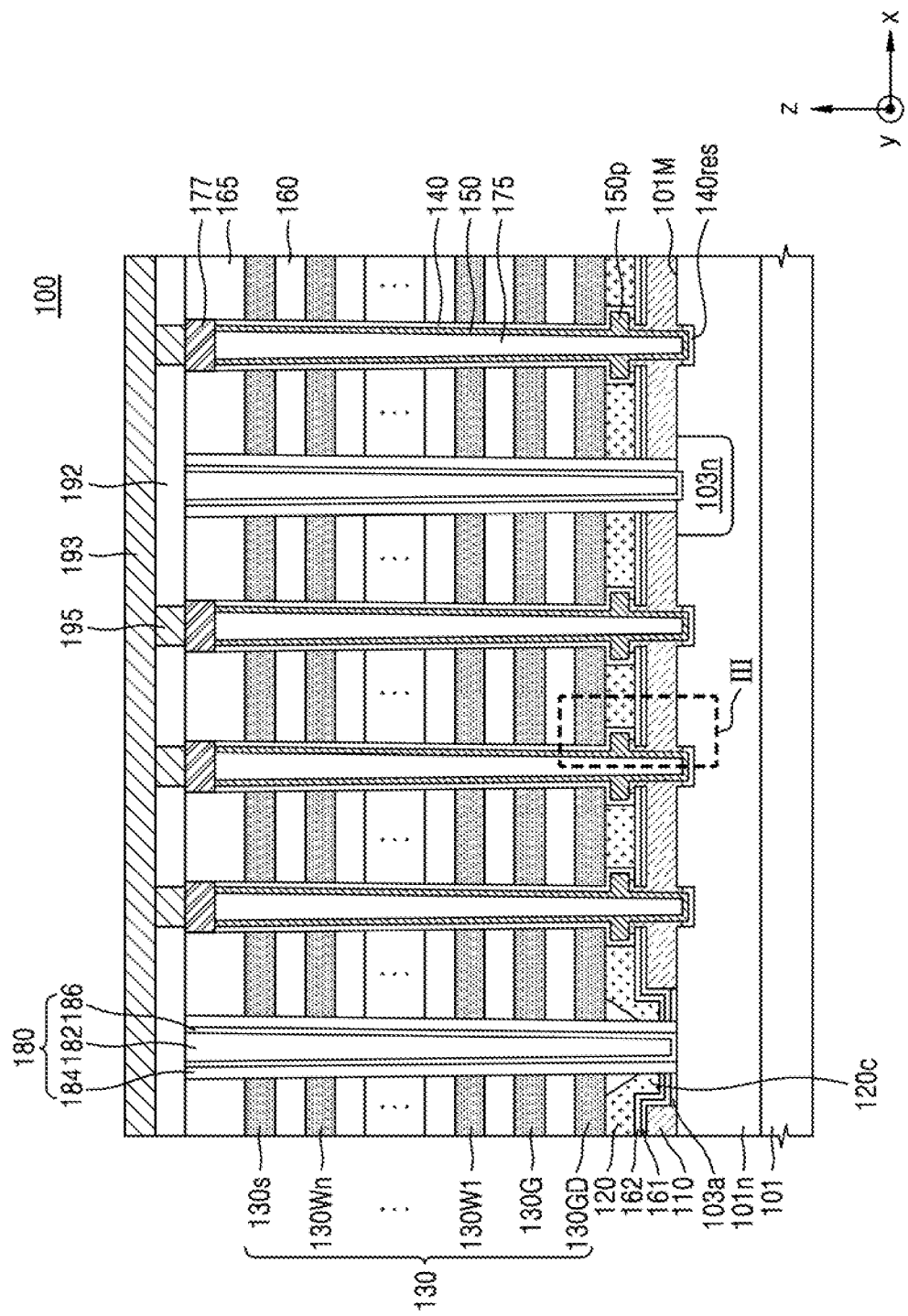
FIG. 2 illustrates a lateral cross-sectional view of a semiconductor device according to embodiments.

FIG. 2 is a lateral cross-sectional view showing a semiconductor device 100 according to embodiments.

Referring to FIG. 2, a substrate 101 may include an upper surface 101M extending in a first horizontal direction (x-direction) and a second horizontal direction (y-direction). The substrate 101 may include a semiconductor material, e.g., a Group IV semiconductor, a Group III-V compound semiconductor, or a Group II-VI oxide semiconductor. For example, the Group IV semiconductor may include monocrystalline silicon (Si), polycrystalline silicon, germanium (Ge), or silicon-germanium. The substrate 101 may be provided as a bulk wafer or an epitaxial layer. In another embodiment, the substrate 101 may include a silicon-on-insulator (SOI) substrate, or a germanium-on-insulator (GeOI) substrate.

The substrate 101 may have a first conductivity type, and a well of a second conductivity type opposite to the first conductive type may be formed in the substrate 101. In some embodiments, the substrate 101 may have a p-conductivity type, and an n-well 101n of an n-conductivity type may be provided in the substrate 101. For example, the substrate 101 may be of a p-conductivity type, and the n-well 101n of an n-conductivity type extending from the upper surface 101M of the substrate 101 to a predetermined depth may be provided in the substrate 101.

The common source semiconductor layer 110 may be provided on the substrate 101. The common source semiconductor layer 110 may include a conductive layer, e.g., a semiconductor layer doped with impurities. In some embodiments, the common source semiconductor layer 110 may include a polysilicon layer doped with impurities. The common source semiconductor layer 110 may be separated by an isolation region 180 and may be configured to contact a common source line 103n provided below, e.g., adjacent, the isolation region 180.

In some embodiments, a protection layer 161 and a support insulating layer 162 may be provided on the common source semiconductor layer 110. For example, as illustrated in FIG. 2, the protection layer 161 may be formed between the support insulating layer 162 and the common source semiconductor layer 110, e.g., to completely separate the support insulating layer 162 and the common source semiconductor layer 110.

The support insulating layer 162 may isolate a support layer 120 (to be described later) from the common source semiconductor layer 110 when the support layer 120 is electrically conductive. The support insulating layer 162 may include, e.g., silicon oxide. In some embodiments, the support insulating layer 162 may include at least one of a high density plasma (HDP) oxide layer, Tetra Ethyl Ortho Silicate (TEOS), Plasma Enhanced-TEOS (PE-TEOS), O3-TEOS, Undoped Silicate Glass (USG), Phospho Silicate Glass (PSG), Boro Silicate Glass (BSG), Boro Phospho Silicate Glass (BPSG), Fluoride Silicate Glass (FSG), Spin On Glass (SOG), and Tonen SilaZene (TOSZ).

The protection layer 161 may protect the support insulating layer 162 from being removed when an information storage layer 140 (to be described later) is partially removed. The protection layer 161 may include, e.g., polysilicon. In some embodiments, the protection layer 161 may include, e.g., polysilicon doped with carbon.

The support layer 120 may be provided on the protection layer 161, e.g., the support insulating layer 162 may be formed between the support layer 120 and the protection layer 161. For example, the support layer 120 may include polysilicon doped or not doped with impurities. The support layer 120 may include, e.g., a support connection structure 120c between the common source semiconductor layers 110.

A plurality of gate electrodes 130 may be stacked on the support layer 120. For example, as illustrated in FIG. 2, the plurality of gate electrodes 130 may include a gate electrode 130GD of the GIDL erase line GEL (see FIG. 1), a gate electrode 130G of the ground selection line GSL (see FIG. 1), gate electrodes 130W1, . . . , 130Wn of the memory cell word lines WL1, . . . , WLn, and a gate electrode 130s of the string selection line SSL (see FIG. 1) may be sequentially provided on the support layer 120 and may be separated from each other by an interlayer insulating layer 160. That is, as illustrated in FIG. 2, the plurality of gate electrodes 130 and a plurality of interlayer insulating layers 160 may be arranged alternately on the support layer 120. An upper interlayer insulating layer 165 may be formed on an uppermost one of the gate electrodes 130, e.g., on the gate electrode 130s of the string selection line SSL.

Each of the gate electrodes 130, i.e., each of the gate electrode 130GD of the GIDL erase line, the gate electrode 130G of the ground selection line GSL, the gate electrodes 130W1, . . . , 130Wn of the memory cell word lines WL1, . . . , WLn, and the gate electrode 130s of the string selection line SSL may include metal, e.g., tungsten (W). Each of the gate electrodes 130 may further include a diffusion barrier, and may include, e.g., any one of tungsten nitride (WN), tantalum nitride (TaN), or titanium nitride (TiN).

A channel hole 150H (FIG. 3) may be provided to pass through the upper interlayer insulating layer 165, the gate electrodes 130, the interlayer insulating layers 160, the support layer 120, the support insulating layer 162, the protection layer 161, and the common source semiconductor layer 110 on the substrate 101. In the channel hole 150H, the information storage layer 140, a channel pattern 150, and a buried insulating layer 175 may be provided.

Figure 3:
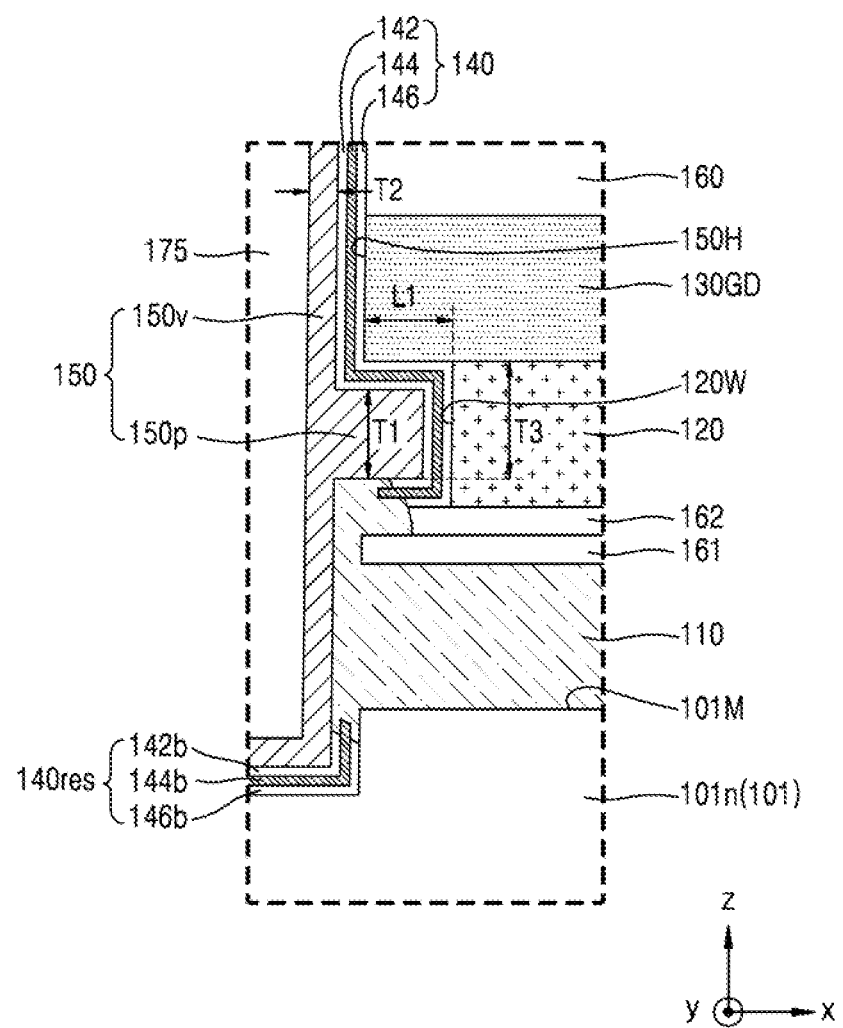
FIG. 3 illustrates an enlarged view of region II in FIG. 2 according to embodiments.
Figure 4:
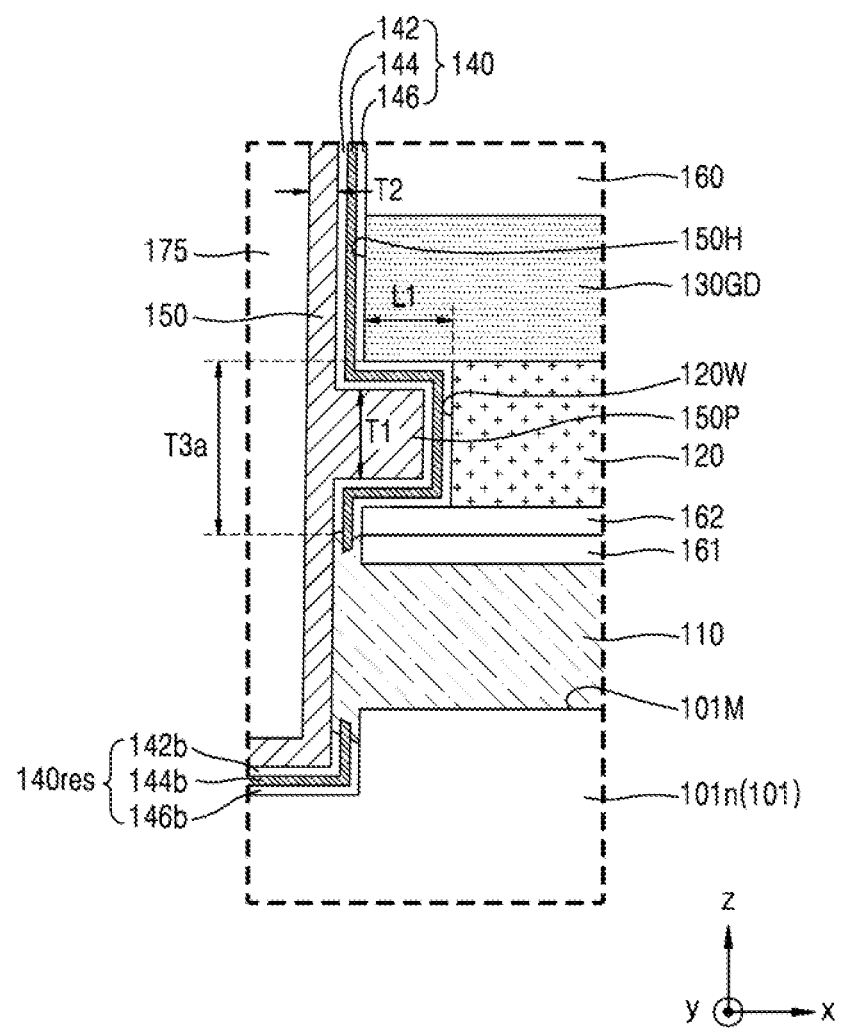
FIG. 4 illustrates an enlarged view of region III in FIG. 2 according to embodiments.

As shown in FIGS. 3 and 4, the information storage layer 140 may have a structure including a tunneling dielectric layer 142, a charge storage layer 144, and a blocking dielectric layer 146 sequentially formed in the stated order from a channel pattern 150 toward a sidewall of the channel hole 150H. e.g., the tunneling dielectric layer 142 may be between the charge storage layer 144 and the channel pattern 150. Relative thicknesses of the tunneling dielectric layer 142, the charge storage layer 144, and the blocking dielectric layer 146 forming the information storage layer 140 are not limited to those illustrated in FIGS. 3 and 4, and may be variously modified.

The tunneling dielectric layer 142 may tunnel charges from the channel pattern 150 to the charge storage layer 144. The tunneling dielectric layer 142 may include, e.g., silicon oxide, hafnium oxide, aluminum oxide, zirconium oxide, tantalum oxide, and the like.

The charge storage layer 144 is a region that may store electrons that passed through the tunneling dielectric layer 142 from the channel pattern 150 and may include a charge trap layer. The charge storage layer 144 may include, e.g., quantum dots or nanocrystals. Here, the quantum dots or the nanocrystals may be composed of fine particles of a conductor, e.g., a metal or a semiconductor. The charge storage layer 144 may include, e.g., silicon nitride, boron nitride, silicon boron nitride, or polysilicon doped with impurities.

The blocking dielectric layer 146 may include, e.g., silicon oxide, silicon nitride, or a high permittivity high-k metal oxide having a higher dielectric constant than silicon oxide. The metal oxide may include, e.g., hafnium oxide, aluminum oxide, zirconium oxide, tantalum oxide, or a combination thereof. Here, the high permittivity metal oxide may refer to a metal oxide having a dielectric constant greater than that of silicon oxide.

The channel pattern 150 may include a semiconductor material, e.g., polysilicon or single crystal silicon. The semiconductor material may be doped with p-conductivity or n-conductivity impurity ions. The buried insulating layer 175 may be provided in the channel pattern 150. In some embodiments, the buried insulating layer 175 may have a general cylindrical pillar structure. For example, as illustrated in FIG. 2, the buried insulating layer 175 may be formed in a center of each of the channel holes 150H, and the channel pattern 150 may be formed along entire sidewalls of the buried insulating layer 175, e.g., the channel pattern 150 may be between the sidewall of the buried insulating layer 175 and a sidewall of the channel hole 150H. In some embodiments, when the channel pattern 150 is formed in a pillar shape, the buried insulating layer 175 may be omitted.

As illustrated in FIG. 3, a residue information storage layer 140res may be provided adjacent to a lower portion of the channel pattern 150. The residue information storage layer 140res may have substantially the same structure as the information storage layer 140, and may be positioned between a bottom of the channel pattern 150 and the n-well 101n of the substrate 101.

The isolation region 180 may be formed between adjacent memory cell strings using different gate electrodes 130. The isolation regions 180 may extend in a second direction (y-direction), may be spaced apart in a first direction (x-direction), and may separate the gate electrodes 130 from each other in the first direction (x-direction). A common source line 103n may be disposed below the isolation region 180.

The isolation region 180 may include a conductive layer 182, a barrier layer 186, and an insulating spacer 184. The conductive layer 182 may include a metal, e.g., tungsten (W), aluminum (Al), titanium (Ti), copper (Cu), etc. The barrier layer 186 may include, e.g., TiN. The insulating spacer 184 may include any insulating material e.g., silicon oxide, silicon nitride, or silicon oxynitride.

For example, as illustrated in FIG. 2, the conductive layer 182, the barrier layer 186, and the insulating spacer 184 may have a structure extending above the gate electrode 130s of the string selection transistors SST (see FIG. 1). In another example, the isolation region 180 may have a structure in which the conductive layer 182 has a small thickness adjacent to the common source line 103n not to extend higher than the lowermost interlayer insulating layer 160, and the buried insulating layer is disposed on an upper portion of the conductive layer 182. When the isolation region 180 has such a structure, the insulating spacer 184 may be omitted. In yet another example, the isolation region 180 may have a structure in which the insulating spacers 184 are formed only to a sidewall of the gate electrode 130G of the ground selection transistor GST (see FIG. 1) such that the conductive layer 182 is formed at a predetermined height between the insulating spacers 184, and the buried insulating layer is disposed on the upper portion of the conductive layer 182.

Bit lines 193 (BL1, BL2, . . . , BLm in FIG. 1) may be connected to drain sides of the string selection transistors SST (see FIG. 1) of the string selection line SSL. For example, the bit lines 193 may extend in the first direction (x-direction) and may be formed in line shapes spaced from each other in the second direction (y-direction). The bit line 193 may be electrically connected to the drains of the string selection transistors SST (see FIG. 1) of the string selection line SSL through a contact plug 195 formed on the channel pattern 150.

FIG. 3 is a partially enlarged view showing in detail region III of FIG. 2 according to an embodiment.

Referring to FIG. 3, the channel pattern 150 may include a channel pattern extension portion 150p. The channel pattern extension portion 150p may be formed integrally with a portion of the channel pattern 150 extending in a vertical direction (z-direction). For example, as illustrated in FIGS. 2-3, the channel pattern 150 may include a vertical portion 150v, e.g., having a linear film shape, that extends along the z-direction and is conformal on the outer sidewall of the buried insulating layer 175, and the channel pattern extension portion 150p may extend laterally away from the vertical portion 150v of the channel pattern 150 along the x-direction, e.g., the channel pattern extension portion 150p and the vertical portion 150v may be integral with each other to define a single and seamless structure.

The vertical portion 150v of the channel pattern 150 may have a thickness T2, e.g., as measured from the buried insulating layer 175 to the information storage layer 140 along the x-direction, in the portion extending in the vertical direction (z-direction). In addition, the channel pattern extension portion 150p may have a thickness T1 in the vertical direction (z-direction), e.g., as measured from a top surface of the common source semiconductor layer 110 along the z-direction. The thickness T1 may be greater than the thickness T2. In some embodiments, the thickness T1 may be at least twice the thickness T2. In some embodiments, the thickness T1 may have a value from about 2 times the thickness T2 (2*T2) to about 100 times the thickness T2 (100*T2), e.g., from about (2*T2) to about (80*T2), from about (2.2*T2) to about (70*T2), and from about (2.5*T2) to about (50*T2).

The support layer 120 may have a side wall 120W which is retreated, e.g., offset, by a length L1 relative to a side wall of the channel hole 150H, e.g., a distance between a sidewall of the channel hole 150H to the lateral side wall 120W of the support layer 120 along the x-direction may be defined as the length L1. As the side wall of the channel hole 150H and a lateral sidewall of the gate electrode 130 contact each other, the side wall 120W of the support layer 120 that faces the channel hole 150H may be retreated, e.g., offset, by the length L1 relative to the side wall of the gate electrode 130, e.g., the gate electrode 130 may extend toward the channel hole 150H to overhang the support layer 120 along the x-direction by the length L1. As a result, the information storage layer 140 may be conformal along lateral sidewalls of the gate electrode 130 and of the support layer 120, i.e., to extend along sidewalls of the interlayer insulating layer 160 and the gate electrode 130 in a vertical direction (z-direction) and extend along a lower surface of the gate electrode 130GD of the GIDL erase line in a horizontal direction (x-direction, y-direction, and/or a combination thereof) toward the support layer 120. Also, the information storage layer 140 may extend in the vertical direction (z-direction) along the sidewall of the support layer 120. For example, the information storage layer 140 may extend to at least a lower end of the support layer 120. For example, the information storage layer 140 may extend to the lower end of the support layer 120 and then extend along an upper surface of the support insulating layer 162 in the horizontal direction (x-direction, y-direction, and/or a combination thereof).

The tunneling dielectric layer 142, the charge storage layer 144, and the blocking dielectric layer 146 constituting the information storage layer 140 may extend horizontally by a predetermined length along the upper surface of the support insulating layer 162 and then terminate. At this time, positions of terminated ends of the tunneling dielectric layer 142 and the blocking dielectric layer 146 may be different from each other in a direction in which the information storage layer 140 extends, e.g., the charge storage layer 144 may extend beyond the tunneling dielectric layer 142 and the blocking dielectric layer 146 along the x-direction.

The channel pattern 150 may extend at least partially to a level lower than the upper surface 101M of the substrate 101, e.g., relative to a bottom of the substrate 101. The residue information storage layer 140res may be provided below the lowermost end of the channel pattern 150. The residue information storage layer 140res may have substantially the same structure as the information storage layer 140. That is, the residue information storage layer 140res may include a residual tunneling dielectric layer 142b, a residual charge storage layer 144b, and a residual blocking dielectric layer 146b, and compositions thereof may be substantially the same as those of the tunneling dielectric layer 142, the charge storage layer 144, and the blocking dielectric layer 146, respectively.

The common source semiconductor layer 110 may extend horizontally along the upper surface 101M of the substrate 101, e.g., along the x-direction, and contact the channel pattern 150. In some embodiments, a portion of the common source semiconductor layer 110 may extend, e.g., continuously, in the vertical direction (z-direction) and also contact the lower surface of the channel pattern extension portion 150p. The common source semiconductor layer 110 may also extend in the horizontal direction (x-direction, y-direction, and/or a combination thereof) while contacting the lower surface of the channel pattern extension portion 150p and may contact an end portion of the information storage layer 140. For example, as illustrated in FIG. 3, a portion of the common source semiconductor layer 110 may extend, e.g., continuously, in the vertical direction (z-direction) along the channel pattern 150 and bend around edges of the protection layer 161 and the support insulating layer 162 (below the channel pattern extension portion 150p) toward edges of the information storage layer 140.

The common source semiconductor layer 110 may be disposed generally below the channel pattern extension portion 150p in the vertical direction (z-direction). For example, a level of the uppermost end of the common source semiconductor layer 110 may be equal to or lower than a level of the lower surface of the channel pattern extension portion 150p in the vertical direction (z-direction).

As shown in FIG. 3, because the uppermost end of the common source semiconductor layer 110 is defined by the channel pattern extension portion 150p, a constant distance between the gate electrode 130GD of the GIDL erase line and the uppermost end of the common source semiconductor layer 110, i.e., distance T3 which is a sum of the thickness T1 and a thickness of the information storage layer 140, may be secured. That is, even though the exact position of the end portion of the information storage layer 140 on the channel pattern extension portion 150p along the horizontal direction may vary, the end portion of the information storage layer 140 is still on, e.g., directly on, the lower surface of the channel pattern extension portion 150p, thereby providing constant distance T3 between the gate electrode 130GD and the common source semiconductor layer 110.

In other words, a position of an end portion of the information storage layer 140 may be somewhat different for each individual semiconductor device due to various parameters in a fabrication process. If a distance between the gate electrode 130GD of the GIDL erase line and the common source semiconductor layer 110 were to be determined according to the position of the end portion of the information storage layer 140, there could be a performance deviation between individual semiconductor devices, e.g., as the position of an end portion of the information storage layer 140 may slightly vary among the individual semiconductor devices. In contrast, in the semiconductor device according to embodiments, as illustrated in FIG. 3, because the end portion of the information storage layer 140 is positioned at an arbitrary point in the horizontal direction (x-direction, y-direction, and/or a combination thereof) along the lower surface of the channel pattern extension portion 150p, even though the position of the end portion of the information storage layer 140 is somewhat different for each individual semiconductor device, the distance T3 between the gate electrode 130GD of the GIDL erase line and the common source semiconductor layer 110 may remain constant. Thus, the performance deviation between individual semiconductor devices may be greatly reduced.

In addition, because an overlapping area between the channel pattern 150 and the gate electrode 130GD of the GIDL erase line increases (i.e., the entire side surface and a part of the lower surface of the gate electrode 130GD), an erase operation using a GIDL method may be more easily performed.

Further, a thickness of the channel pattern extension portion 150p may be sufficiently great, and thus, a concentration of impurities (for example, phosphorus (P)) due to diffusion may be sufficiently secured.

FIG. 4 is a partially enlarged view showing in detail a region III of FIG. 2 in the semiconductor device 100 according to another embodiment. The embodiment shown in FIG. 4 is the same as the embodiment shown in FIG. 3, except that the information storage layer 140 further includes a vertical extension portion extending in a vertical direction (z-direction) from a lower portion of the channel pattern extension portion 150p. Therefore, the following description focuses on this difference.

Referring to FIG. 4, in some embodiments, an end portion of the information storage layer 140 may have a level between a lower surface of the protection layer 161 and an upper surface of the support insulating layer 162. That is, as illustrated in FIG. 4, the end portion of the information storage layer 140 may bend to extend along and overlap at least a terminal edge of the support insulating layer 162 among the protection layer 161 and the support insulating layer 162. A level of the uppermost end of the common source semiconductor layer 110 may be defined by the end portion of the information storage layer 140. A distance between the gate electrode 130GD of the GIDL erase line GEL and the common source semiconductor layer 110 may be determined as T3a according to a position of the end portion of the information storage layer 140.

In the embodiments of FIG. 4, the common source semiconductor layer 110 may be in direct contact with the end portion of the information storage layer 140. In the embodiment of FIG. 3, the common source semiconductor layer 110 may be in direct contact with the lower surface of the channel pattern extension portion 150p and the end portion of the information storage layer 140.

Figure 5:
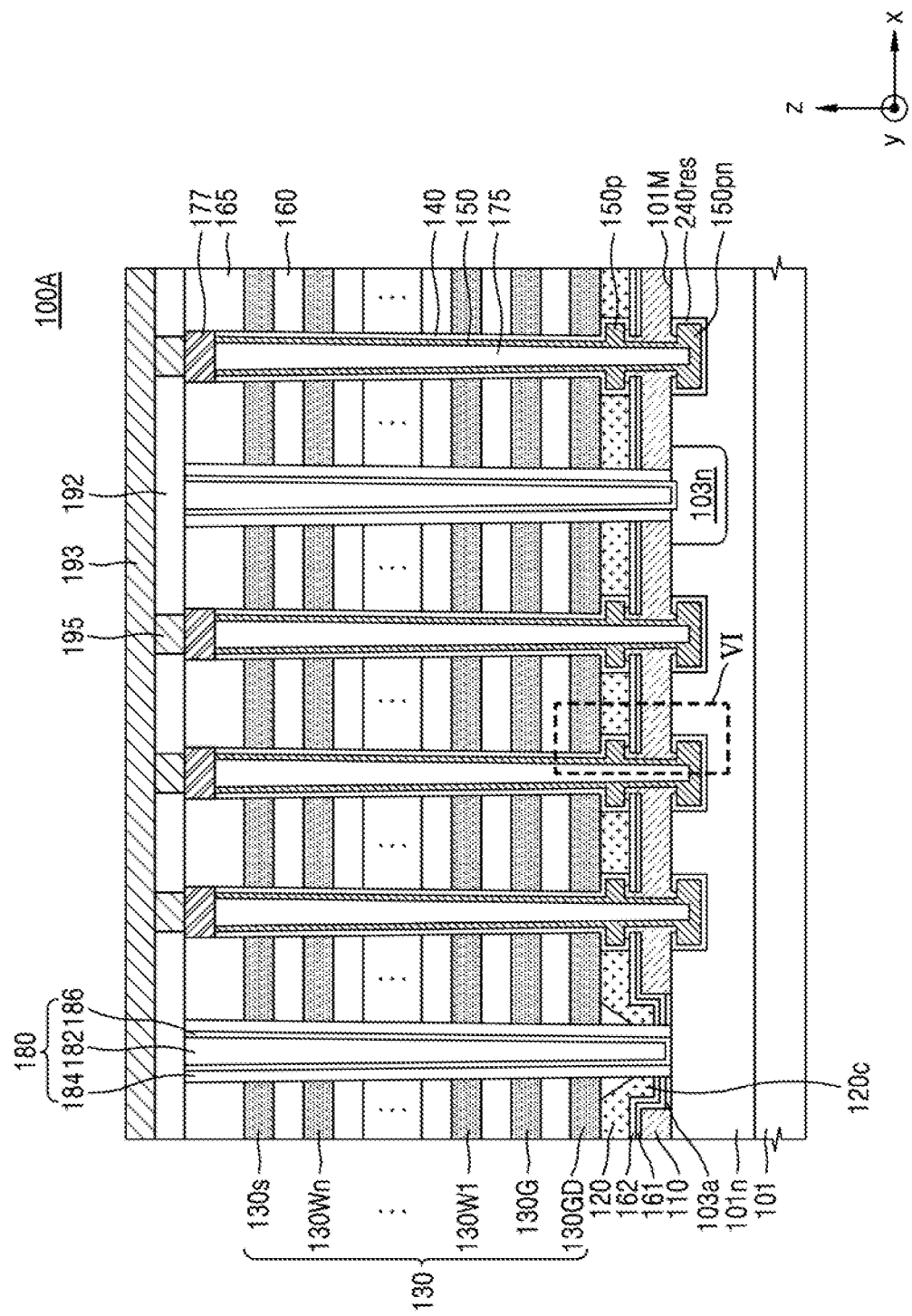
FIG. 5 illustrates a lateral cross-sectional view of a semiconductor device according to embodiments.

FIG. 5 is a lateral cross-sectional view showing a semiconductor device 100A according to other embodiments. The semiconductor device 100A according to embodiment shown in FIG. 5 has a major difference in a structure of a lower end portion of the channel pattern 150 as compared with the semiconductor device 100 shown in FIG. 2. Therefore, the following description will focus on this difference.

Referring to FIG. 5, the substrate 101 may include polycrystalline silicon doped with p-conductivity and may include the n-well 101n of an n-conductivity type having a predetermined depth in the upper surface 101M of the substrate 101. A lower end of the channel pattern 150 may extend to a level lower than the upper surface 101M of the substrate 101. The lower end of the channel pattern 150 may include a lower extension portion 150pn extending by a predetermined distance in a lateral direction (x-direction, y-direction, and/or a combination thereof) at the level lower than the upper surface 101M of the substrate 101. In some embodiments, a sidewall of the lower extension portion 150pn may be substantially aligned with a sidewall of the channel pattern extension portion 150p.

A residue information storage layer 240res may be provided on the sidewall and a lower surface of the lower extension portion 150pn. In addition, the residue information storage layer 240res may partially extend onto an upper surface of the lower extension portion 150pn. The residue information storage layer 240res may have substantially the same configuration as the information storage layer 140, which will be described in more detail later. A sidewall of the residue information storage layer 240res may be substantially aligned with a sidewall of the information storage layer 140.

Figure 6:
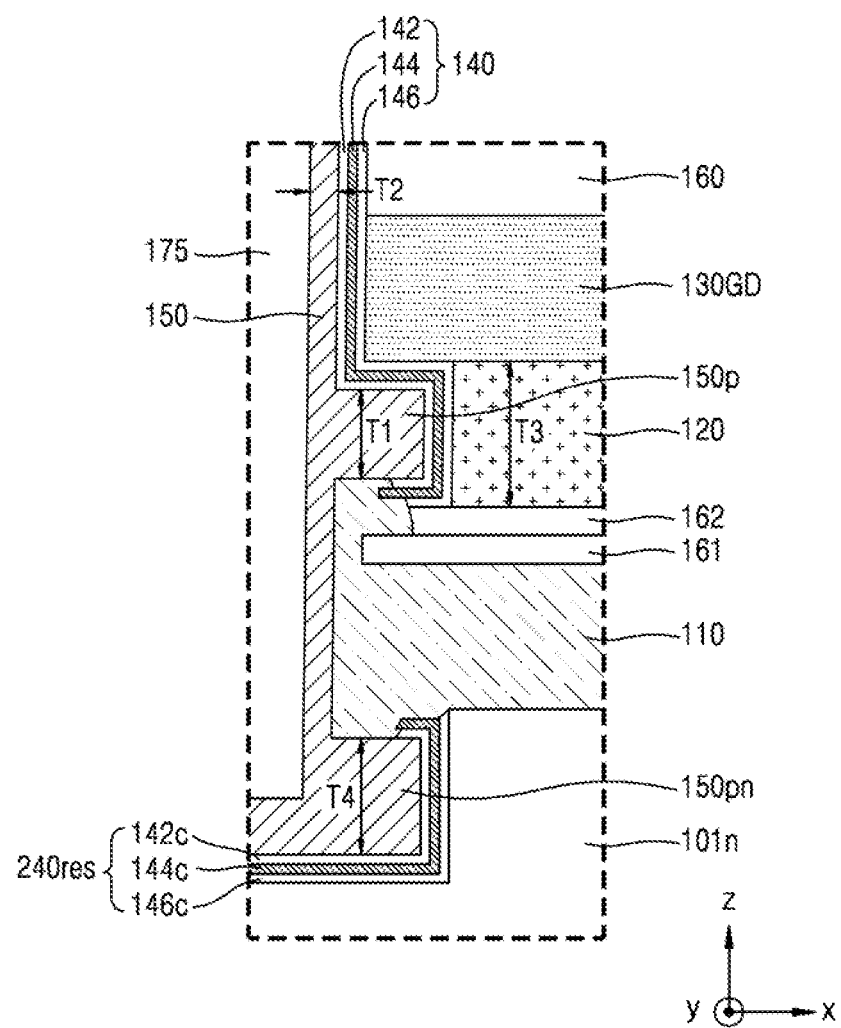
FIG. 6 illustrates an enlarged view of region VI in FIG. 5 according to embodiments.

FIG. 6 is a partially enlarged view showing in detail a region VI of the semiconductor device 100A of FIG. 5 according to an embodiment. The semiconductor device 100A according to an embodiment shown in FIG. 6 has a major difference in a structure of a lower end portion of the channel pattern 150 as compared with the semiconductor device 100 shown in FIG. 3. Therefore, the following description will focus on this difference.

Referring to FIG. 6, a dimension in which the lower extension portion 150pn protrudes in a horizontal direction (x-direction, y-direction, and/or a combination thereof) may be substantially the same as a dimension in which the channel pattern extension portion 150p protrudes in the horizontal direction. As a result, a sidewall of the lower extension portion 150pn may be substantially aligned with a sidewall of the channel pattern extension portion 150p, e.g., extension portions 150p and 150pn may vertically overlap each other.

The residue information storage layer 240res may include a residual tunneling dielectric layer 142c, a residual charge storage layer 144c, and a residual blocking dielectric layer 146c, and compositions thereof may be substantially the same as those of the tunneling dielectric layer 142, the charge storage layer 144, and the blocking dielectric layer 146, respectively. In some embodiments, a sidewall of the information storage layer 140 (i.e. a sidewall of the support layer 120) on the sidewall of the channel pattern extension portion 150p may be substantially aligned with a sidewall of the residue information storage layer 240res.

The residual tunneling dielectric layer 142c and the residual charge storage layer 144c may conformally extend along a lower surface and a side surface of the lower extension portion 150pn. In addition, the residual tunneling dielectric layer 142c and the residual charge storage layer 144c may extend by a predetermined length along an upper surface of the lower extension portion 150pn. The residual blocking dielectric layer 146c may conformally extend along a lower surface and a side surface of the lower extension portion 150pn. The residual blocking dielectric layer 146c may not extend onto the upper surface of the lower extension portion 150pn.

In some embodiments, a thickness T4 of the lower extension portion 150pn in a vertical direction (z-direction) may be greater than or equal to the thickness T1 of the channel pattern extension portion 150p in the vertical direction (z-direction). When the thickness T4 is greater than the thickness T1, the buried insulating layer 175 may partially extend into the lower extension portion 150pn unlike in FIG. 6.

In the case where a polycrystalline silicon substrate (i.e., polysilicon) is used as the substrate 101, when the support layer 120 is partially removed to retreat, e.g., offset, the sidewall of the support layer 120, because the substrate 101 is partially removed similarly to the support layer 120, a space is formed in which the lower extension portion 150pn is to be formed. Also, in a subsequent process, the residue information storage layer 240res and the lower extension portion 150pn may fill the space.

FIGS. 7A to 7I are lateral cross-sectional views of stages in a method of fabricating the semiconductor device 100, according to an embodiment.

Figure 7A:
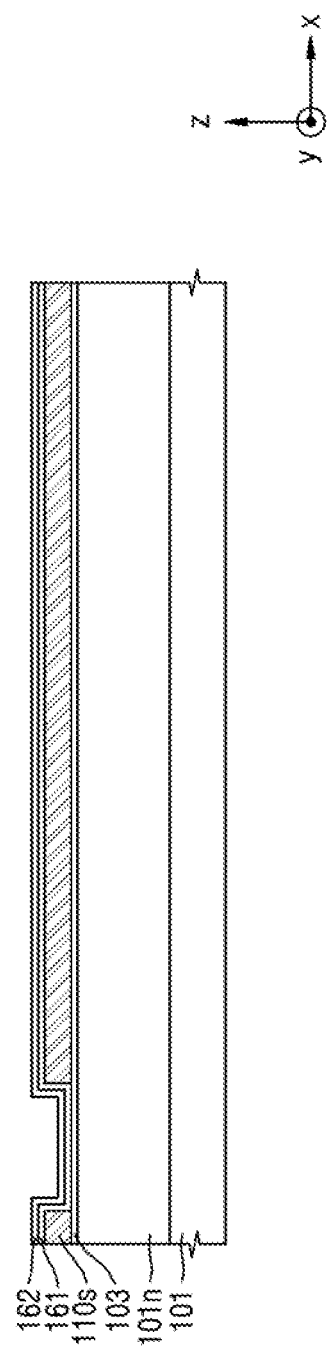

Referring to FIG. 7A, a protection insulating layer 103 is formed on the substrate 101 on which the n-well 101n is formed, and a lower sacrificial layer pattern 110s is formed on the protection insulating layer 103. The lower sacrificial layer pattern 110s may be formed by, e.g., performing a photolithography process after forming a lower sacrificial material layer. The lower sacrificial layer pattern 110s may include, e.g., silicon nitride. The protection insulating layer 103 may include any material having etch selectivity with respect to the lower sacrificial layer pattern 110s and may include, e.g., silicon oxide.

After forming the lower sacrificial layer pattern 110s, the protection layer 161 and the support insulating layer 162 are sequentially and conformally formed on the upper surface and the side surface of the lower sacrificial layer pattern 110s and the protection insulating layer 103, which is partially exposed. The protection layer 161 may include, e.g., polysilicon. In some embodiments, the protection layer 161 may include polysilicon doped with carbon. The support insulating layer 162 may include silicon oxide, which has been described in detail with reference to FIG. 2 and thus a detailed description thereof is omitted. The protection layer 161 and the support insulating layer 162 may be formed by chemical vapor deposition (CVD), physical vapor deposition (PVD), or atomic layer deposition (ALD), but are not limited thereto.

Figure 7B:
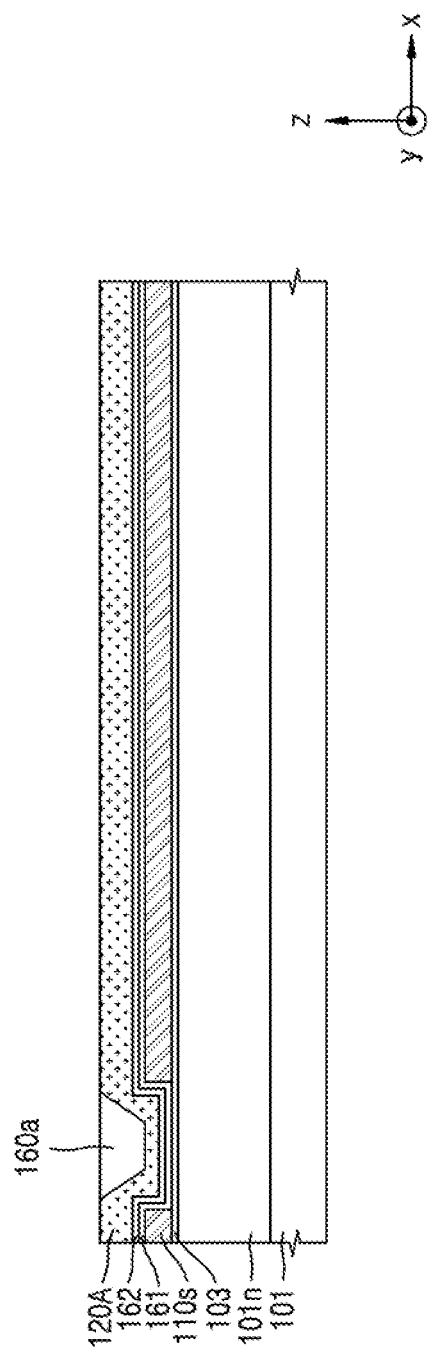

Referring to FIG. 7B, a support layer material layer 120A may be formed on the support insulating layer 162 and an insulating layer 160a may be formed thereon. The support layer material layer 120A may include doped or undoped polysilicon, and the insulating layer 160a may include any insulating layer, e.g., silicon nitride, silicon oxide, or silicon oxynitride. The insulating layer 160a may be formed by forming an insulating material layer on the polysilicon and then performing chemical mechanical polishing (CMP) so that the upper surface of the support layer material layer 120A is exposed.

Referring to FIG. 7C, sacrificial layers 130h and the interlayer insulating layers 160 may be alternately stacked on the support layer material layer 120A and the insulating layer 160a. According to some embodiments, the interlayer insulating layers 160 and the sacrificial layers 130h may include different materials. According to some embodiments, the interlayer insulating layers 160 and the sacrificial layers 130h may include materials having high etch selectivity with respect to each other. For example, when the sacrificial layers 130h include silicon oxide, the interlayer insulating layers 160 may include silicon nitride. As another example, when the sacrificial layers 130h include silicon nitride, the interlayer insulating layers 160 may include silicon oxide. As another example, when the sacrificial layers 130h include undoped polysilicon, the interlayer insulating layers 160 may include silicon nitride or silicon oxide. The sacrificial layers 130h and the interlayer insulating layers 160 may be formed by CVD, PVD, or ALD.

Figure 7D:
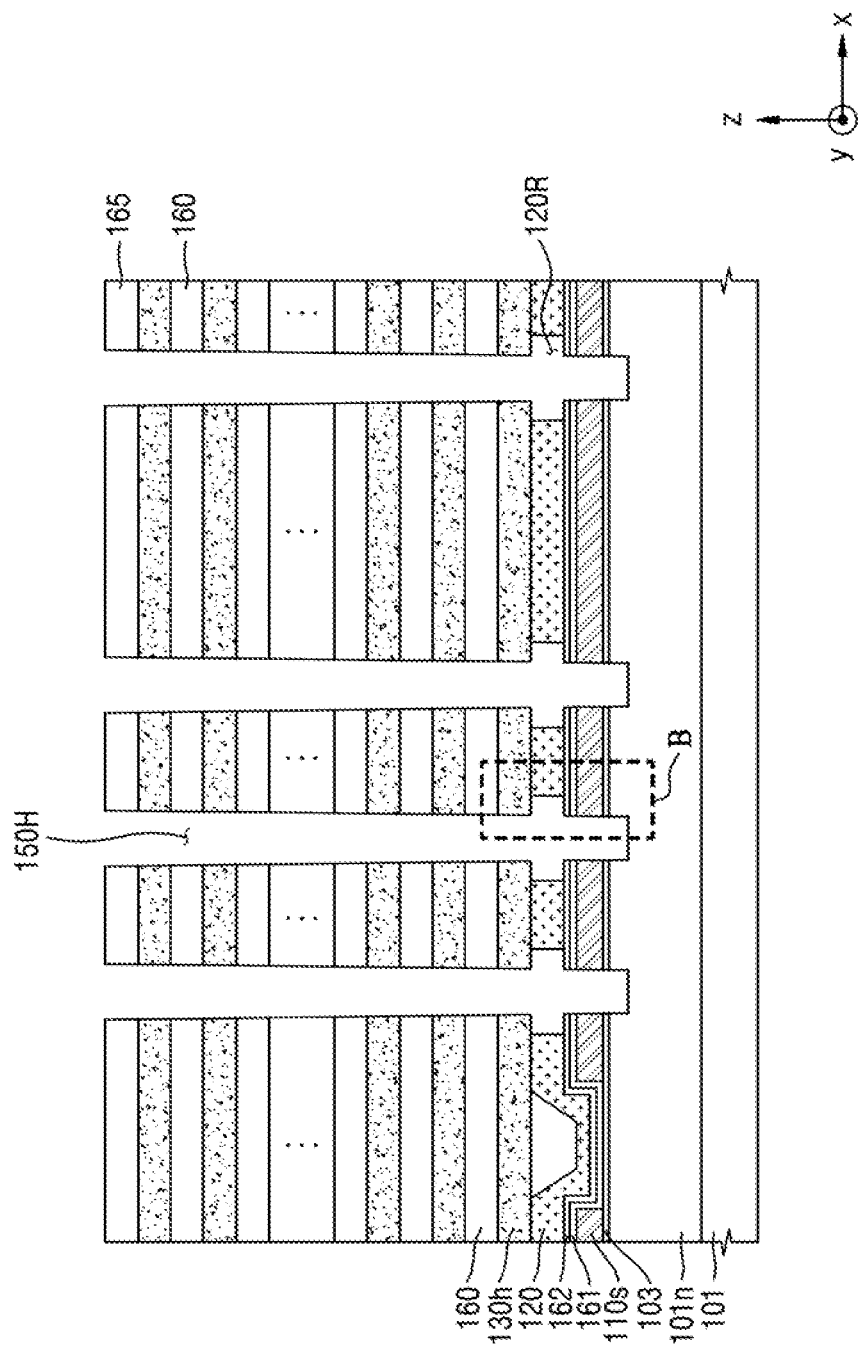
Figure 8:
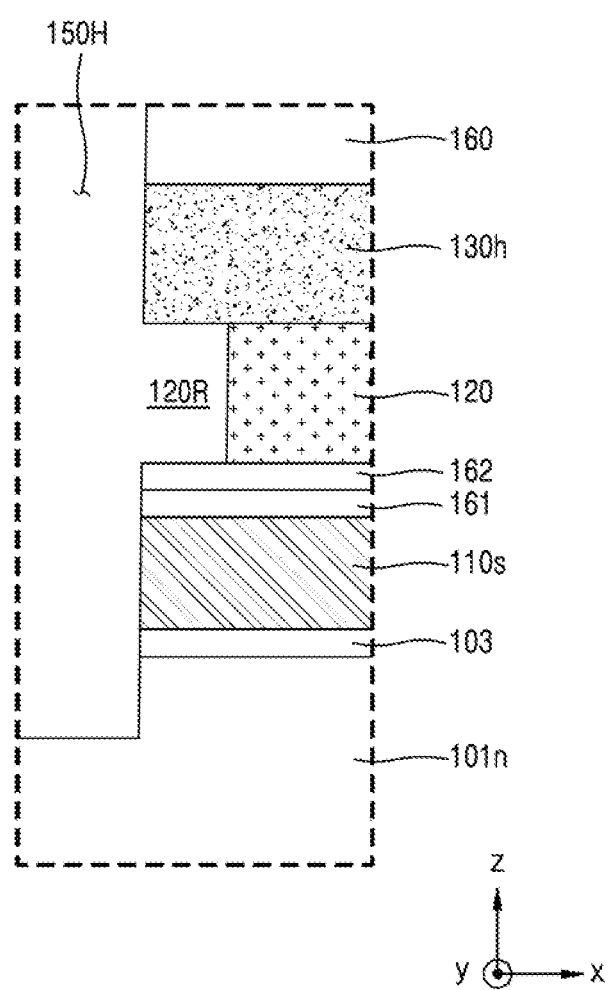
FIGS. 8 to 10 illustrate enlarged views of region B in FIGS. 7D to 7F, respectively.

FIG. 8 is a partially enlarged view showing in detail a region B of FIG. 7D.

Referring to FIGS. 7D and 8, the channel hole 150H that sequentially passes through the sacrificial layers 130h and the interlayer insulating layers 160, the support layer material layer 120A, the support insulating layer 162, the protection layer 161, the lower sacrificial layer pattern 110s, and the protection insulating layer 103 may be formed. The channel hole 150H may be formed by anisotropic etching.

Subsequently, a support layer recess 120R may be formed by partially removing the support layer 120 and retreating, e.g., offsetting, the sidewall of the support layer 120. The sidewall of the support layer 120 may be retreated, e.g., positioned farther, from the sidewall of the channel hole 150H thereabove. The sidewall of the support layer 120 may be further retreated, e.g., offset, from a sidewall of the sacrificial layer 130h positioned directly on the support layer 120, e.g., a portion of the support layer 120 may be removed to have the sacrificial layer 130h directly on the support layer 120 overhang the support layer 120.

Partial removal of the support layer 120 may be performed, e.g., by selective isotropic etching of the support layer 120 including polysilicon. According to a selection of an etchant, polysilicon and single crystal silicon may be different in terms of an etch selectivity. At this time, when the substrate 101 is single crystal silicon, it is possible to selectively remove the support layer 120 without substantially removing the single crystal silicon.

Figure 7E:
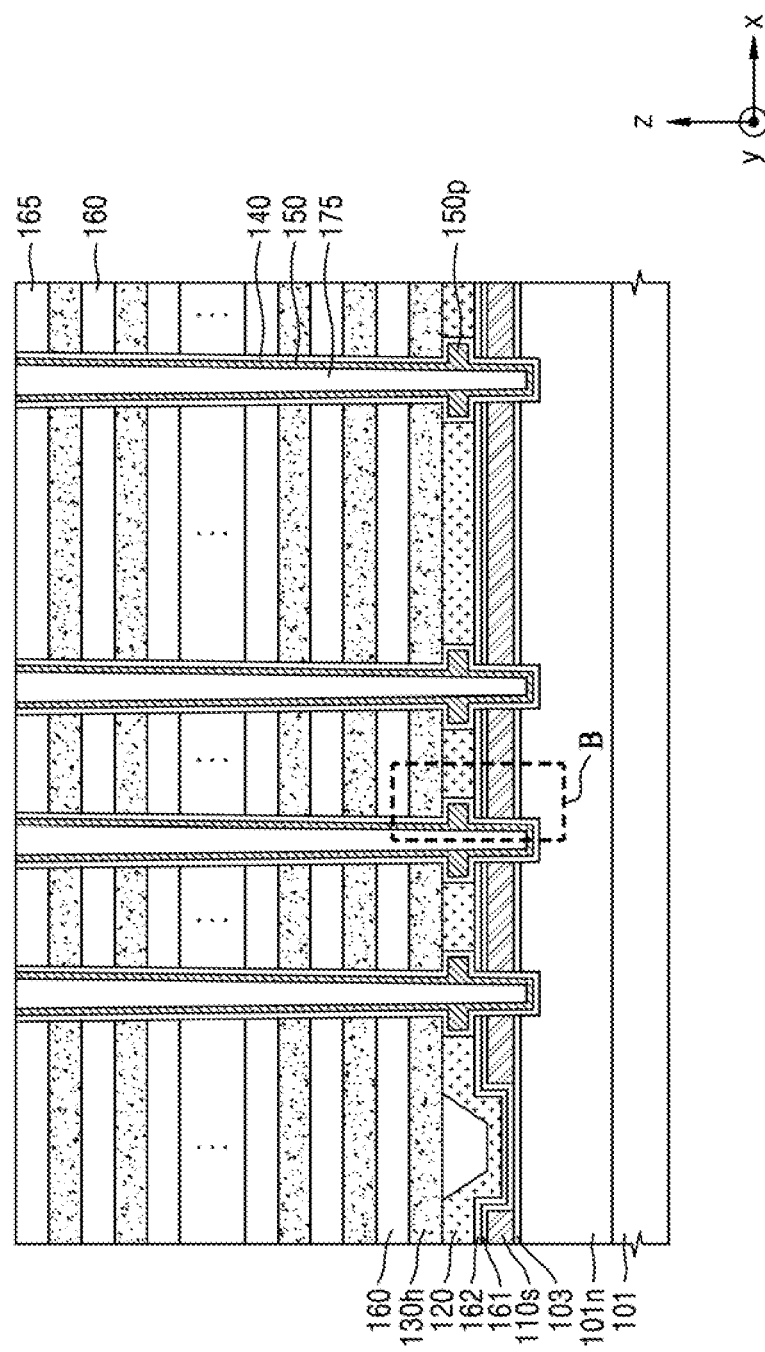
Figure 9:
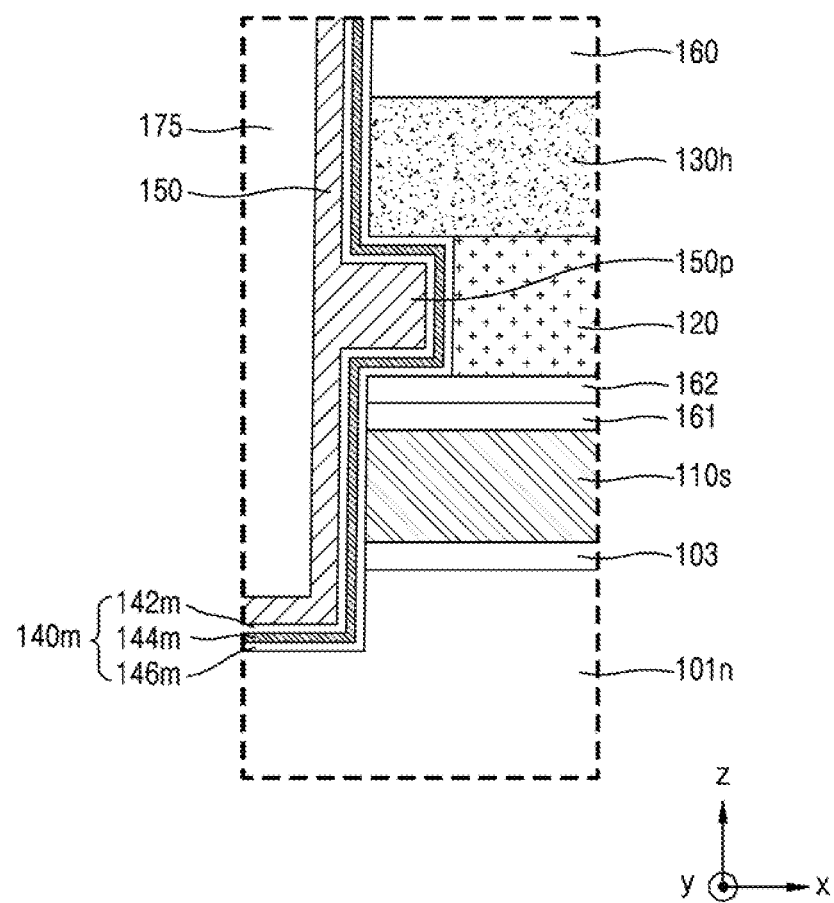

FIG. 9 is a partially enlarged view showing in detail the region B of FIG. 7E.

Referring to FIGS. 7E and 9, an information storage material layer 140m may be substantially conformally formed on an exposed inner surface of the channel hole 150H. In detail, a blocking dielectric material layer 146m, a charge storage material layer 144m, and a tunneling dielectric material layer 142m may be formed conformally from the side wall of the channel hole 150H, and may be formed by using e.g., ALD. The blocking dielectric material layer 146m, the charge storage material layer 144m, and the tunneling dielectric material layer 142m may respectively include substantially the same material as the blocking dielectric layer 146, the charge storage layer 144, and the tunneling dielectric layer 142, and thus detailed descriptions thereof will be omitted.

The channel pattern 150 may then be formed on the inner surface of the tunneling dielectric material layer 142m. The channel pattern 150 may be formed by, e.g., CVD or ALD. The channel pattern 150 may be formed to fill the inside of the support layer recess 120R, thereby forming the channel pattern extension portion 150p. In an implementation, the channel pattern 150 may completely fill the inside of the support layer recess 120R. In some embodiments, the channel pattern 150 may be formed to have a greater thickness to completely fill the inside of the support layer recess 120R and then be anisotropically etched to a desired thickness.

Then, an inner space of the channel pattern 150 may be filled by the buried insulating layer 175. A formation of the buried insulating layer 175 may be performed by e.g., CVD or ALD.

Figure 7F:
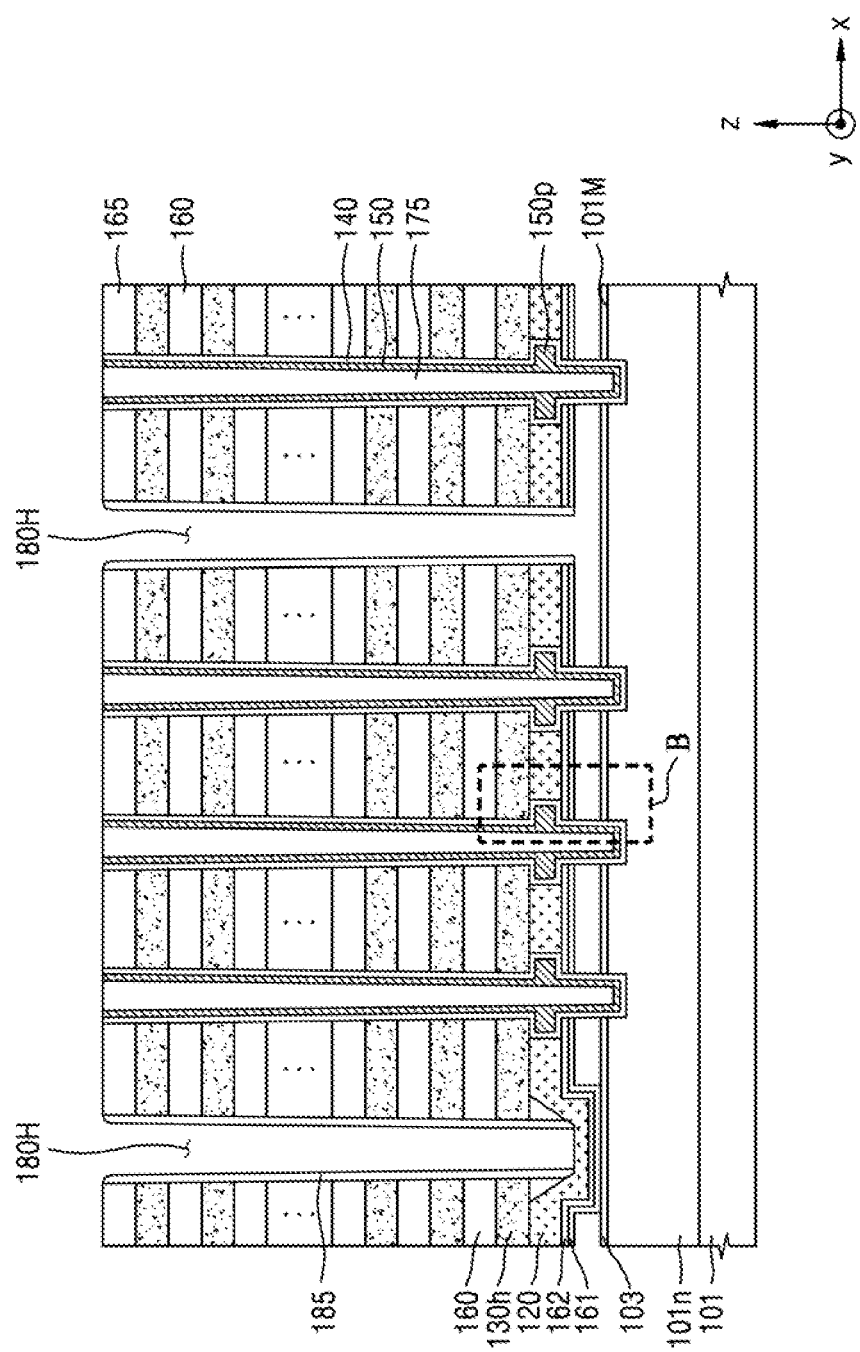
Figure 10:
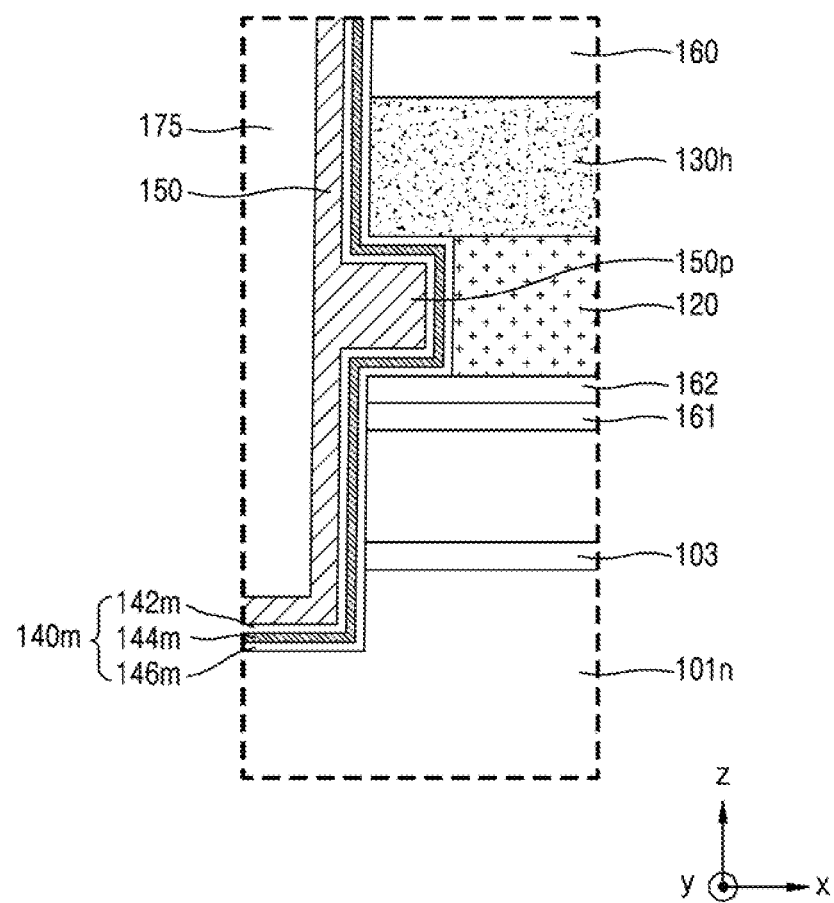

FIG. 10 is a partially enlarged view showing in detail the region B of FIG. 7F.

Referring to FIGS. 7F and 10, a mask pattern may be formed on the upper interlayer insulating layer 165, and a word line cut opening 180H may be formed using the mask pattern as an etching mask. An upper surface of the lower sacrificial layer pattern 110s may be exposed at a bottom portion of the word line cut opening 180H. In some embodiments, an upper surface of the substrate 101 may be exposed at the bottom portion of the word line cut opening 180H.

Thereafter, a spacer 185 may be formed to cover an upper surface of the upper interlayer insulating layer 165 and a sidewall of the word line cut opening 180H. In exemplary embodiments, the spacer 185 may be selected to have a high etch selectivity with respect to the lower sacrificial layer pattern 110s. For example, the spacer 185 may be silicon oxide, silicon oxynitride, or the like.

Subsequently, the lower sacrificial layer pattern 110s may be removed by selective etching. In some embodiments, the lower sacrificial layer pattern 110s may be removed by wet or dry isotropic etching. The protection insulating layer 103 may prevent the substrate 101 from being damaged when the lower sacrificial layer pattern 110s is selectively removed. By removing the lower sacrificial layer pattern 110s, the side surface of the information storage material layer 140m having the same level as the lower sacrificial layer pattern 110s may be exposed.

Figure 7G:
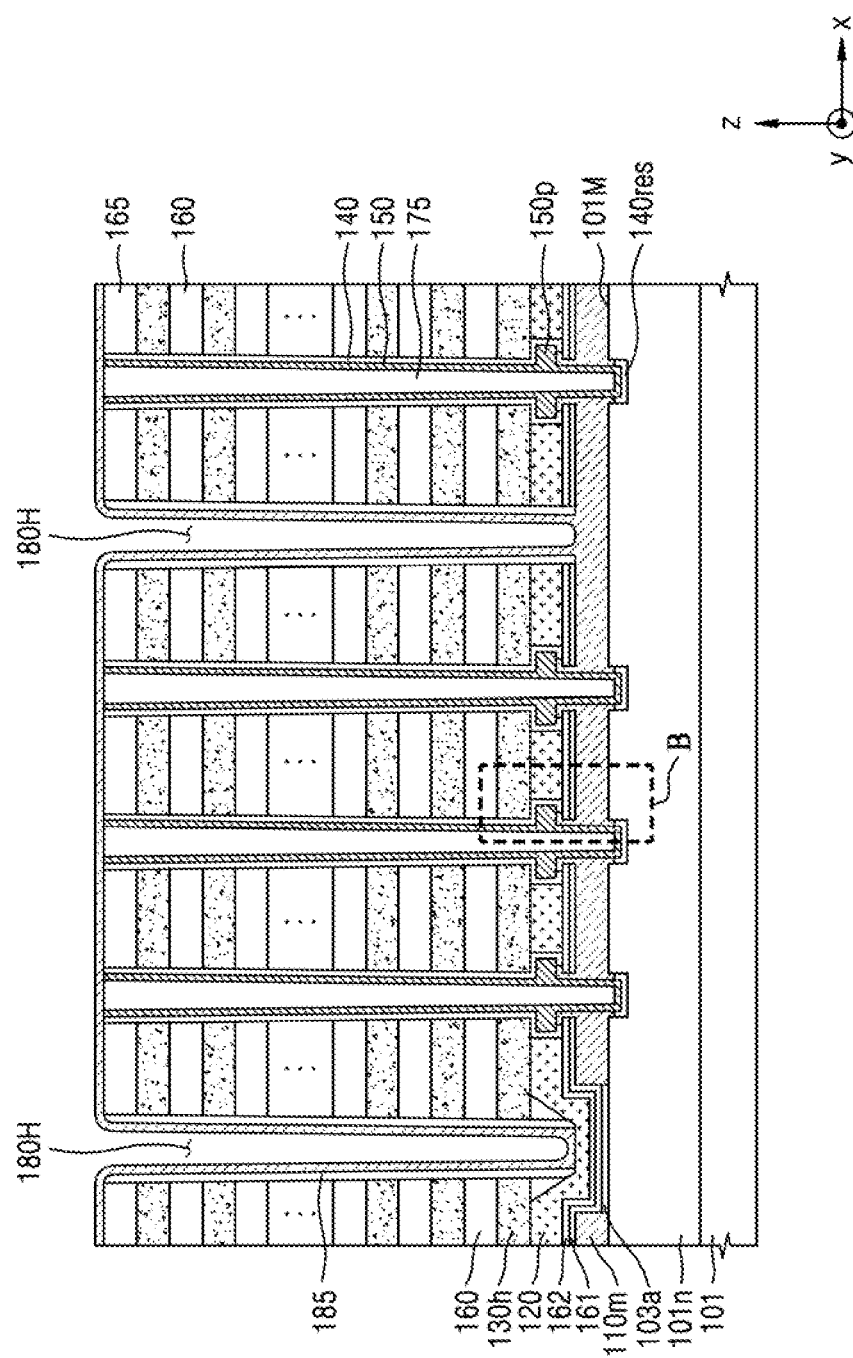
Figure 11:
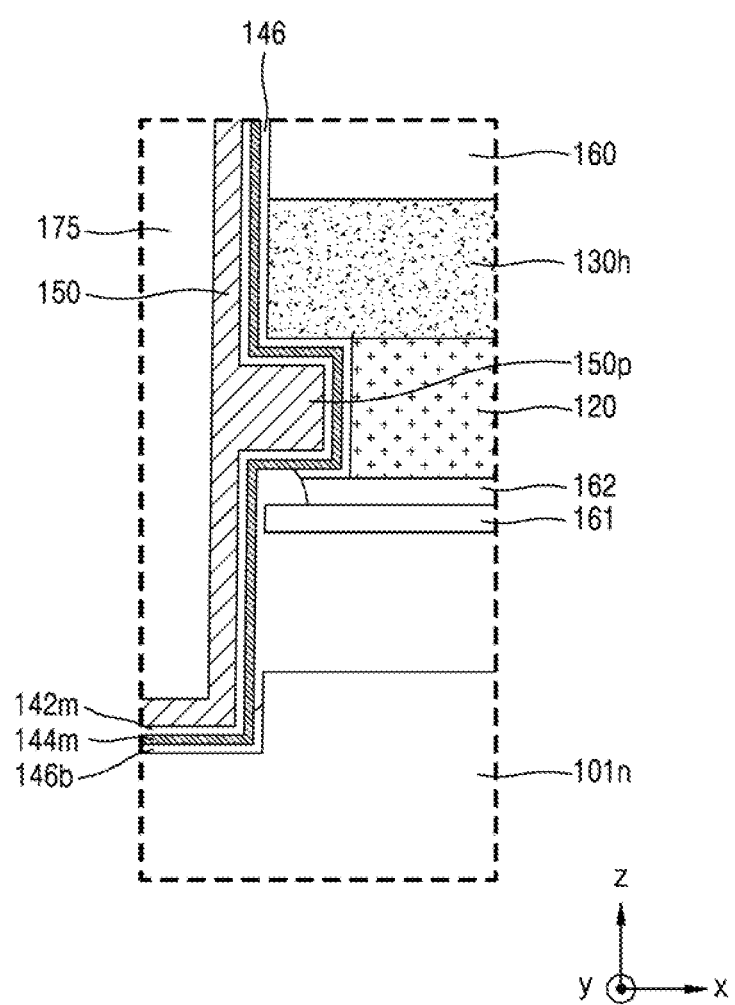
FIGS. 11 to 13 illustrate lateral cross-sectional views of stages in a method of removing an exposed part of an information storage material layer.
Figure 12:
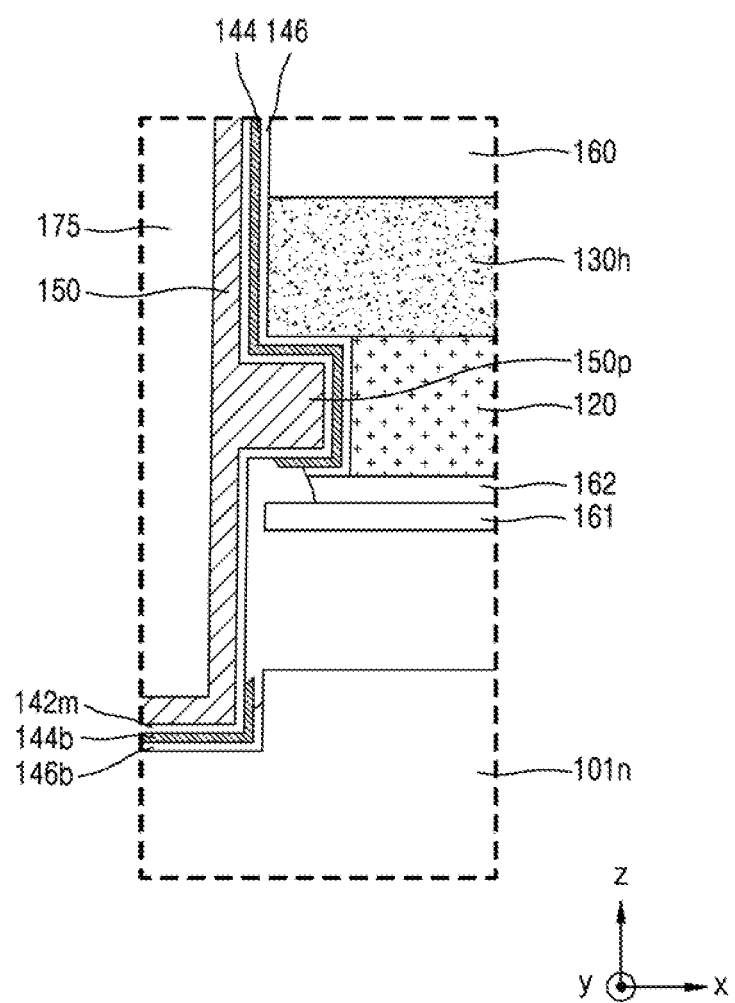
Figure 13:
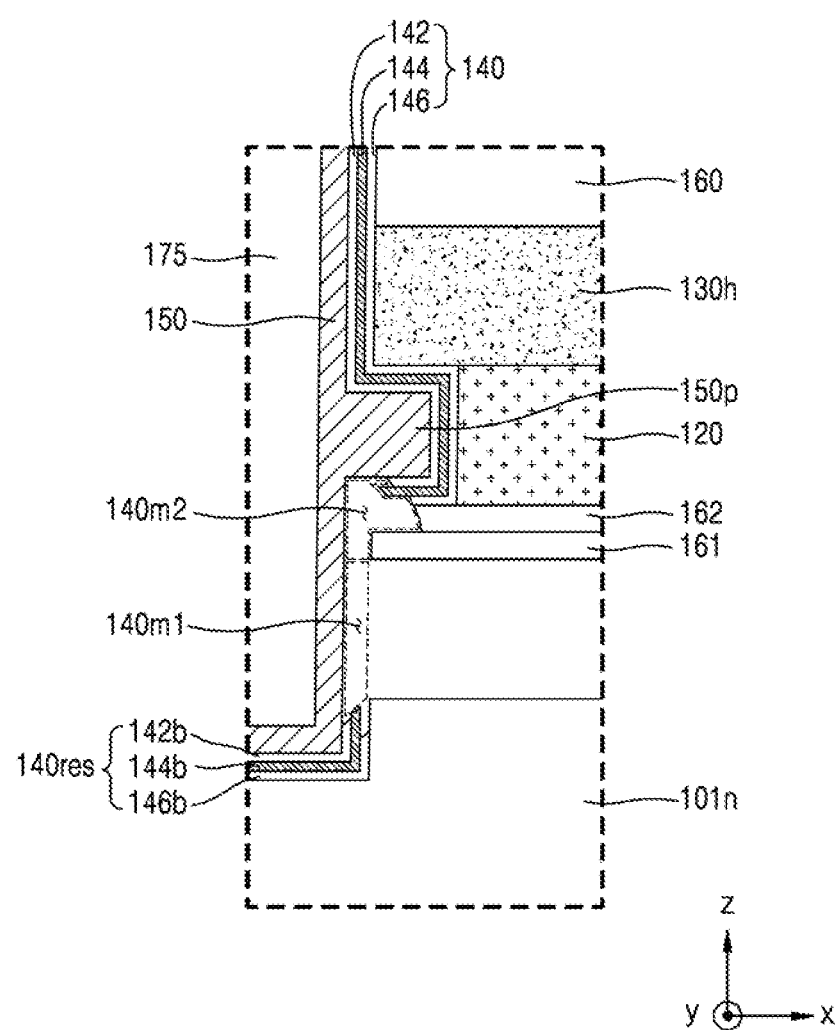

FIGS. 11 to 13 are lateral cross-sectional views showing stages in a method of removing an exposed part of the information storage material layer 140m which may correspond to the region B of FIG. 7G.

Referring to FIG. 11, an exposed part of the blocking dielectric material layer 146m (FIG. 10) may be removed by isotropic etching. The blocking dielectric layer 146 and the residual blocking dielectric layer 146b may be formed by partially removing the blocking dielectric material layer 146m. In this case, when the support insulating layer 162 has an etching characteristic similar to that of the blocking dielectric material layer 146m, the support insulating layer 162 may be partially removed together with the blocking dielectric material layer 146m, e.g., to form the opening through the blocking dielectric material layer 146m adjacent the support insulating layer 162 and the residual blocking dielectric layer 146b. In addition, when the protection insulating layer 103 has an etching characteristic similar to that of the blocking dielectric material layer 146m, the protection insulating layer 103 may be removed together with the blocking dielectric material layer 146m.

Referring to FIG. 12, an exposed part of the charge storage material layer 144m (FIG. 10) may be removed by isotropic etching. The charge storage layer 144 and the residual charge storage layer 144b may be formed by partially removing the charge storage material layer 144m, e.g., to form the opening through the charge storage material layer 144m adjacent the support insulating layer 162 and the residual blocking dielectric layer 146b.

Referring to FIG. 13, an exposed part of the tunneling dielectric material layer 142m (FIG. 10) may be removed by isotropic etching. The tunneling dielectric layer 142 and the residual tunneling dielectric layer 142b may be formed by partially removing the tunneling dielectric material layer 142m.

An end portion of the tunneling dielectric layer 142 and an end portion of the blocking dielectric layer 146 are not necessarily aligned with each other. In some embodiments, the end portion of the tunneling dielectric layer 142 may protrude toward the channel pattern 150 in a horizontal direction compared to the end portion of the blocking dielectric layer 146.

By summarizing FIGS. 11 to 13, the information storage layer 140 may be formed by removing a first portion 140m1 that is the exposed part of the information storage material layer 140m and a second portion 140m2 adjacent to the first portion 140m1. Also, by removing the first portion 140m1 and the second portion 140m2, the residue information storage layer 140res may be formed adjacent to a lower end of the channel pattern 150.

In FIG. 13, end portions of the tunneling dielectric layer 142, the charge storage layer 144, the blocking dielectric layer 146, and the support insulating layer 162 are formed in curved surfaces, but embodiments are not limited thereto. In FIG. 13, end portions of the tunneling dielectric layer 142, the charge storage layer 144, and the blocking dielectric layer 146 are disposed on a lower surface of the channel pattern extension portion 150p, but embodiments are not limited thereto. In some embodiments, the end portions of the tunneling dielectric layer 142, the charge storage layer 144, and the blocking dielectric layer 146 may be disposed on a side surface of the protection layer 161.

Figure 14:
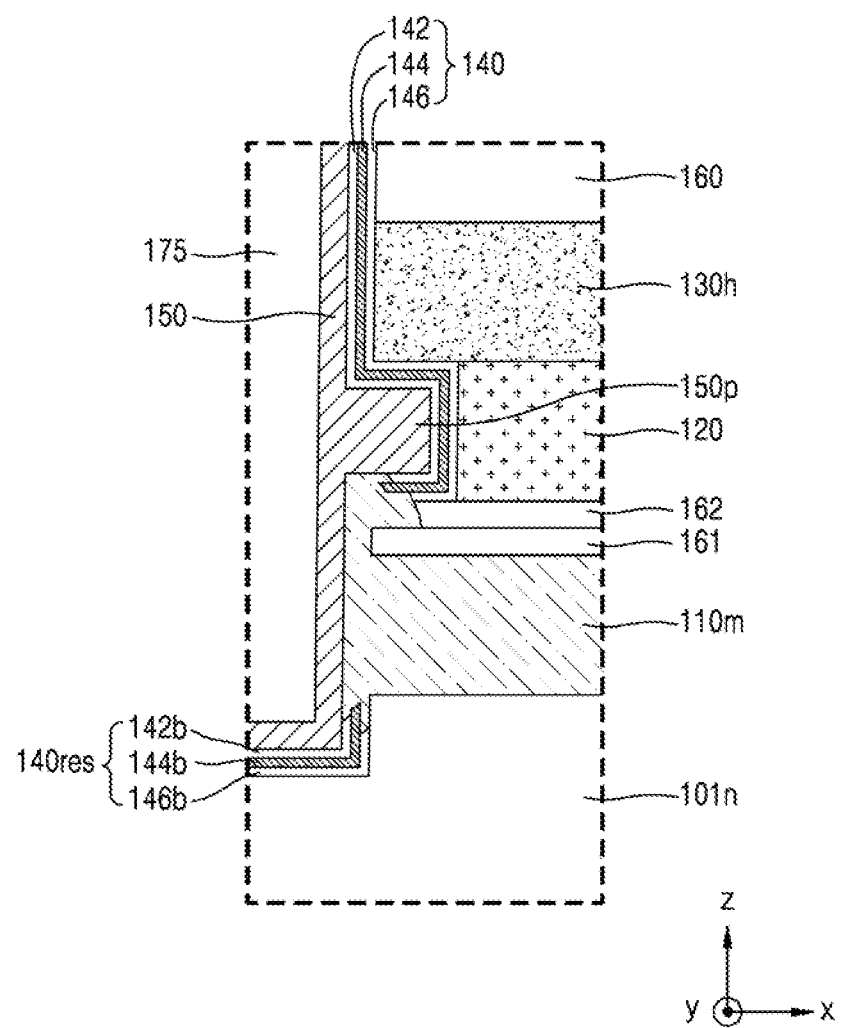
FIG. 14 illustrates an enlarged view of region B in FIG. 7G.

FIG. 14 is a partially enlarged view showing in detail the region B of FIG. 7G.

Referring to FIGS. 7G and 14, a common source semiconductor material layer 110m may be provided to bury a part where the lower sacrificial layer pattern 110s is removed and a part where the information storage material layer 140m is removed. The common source semiconductor material layer 110m may be formed by diffusing and depositing a reactant to the part where the lower sacrificial layer pattern 110s is removed and the part where the information storage material layer 140m is removed through the word line cut opening 180H.

The common source semiconductor material layer 110m may be deposited on a surface of an exposed sidewall (i.e., the spacer 185) of the word line cut opening 180H and on the upper interlayer insulating layer 165. The common source semiconductor material layer 110m may be formed by, e.g., CVD, ALD, or the like. The common source semiconductor material layer 110m may be a polysilicon layer doped with impurities.

Figure 7H:
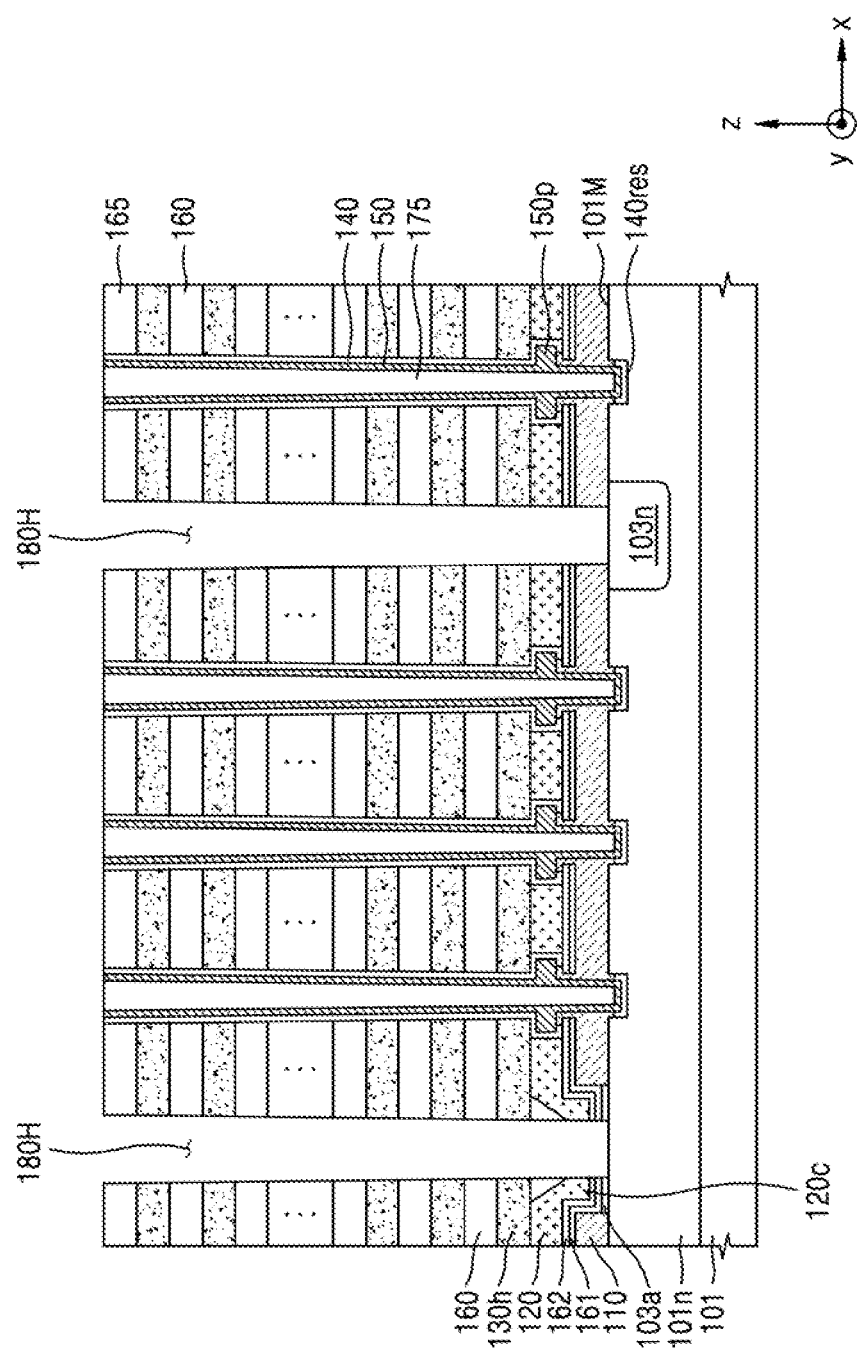

Referring to FIG. 7H, an upper surface of the substrate 101 may be exposed by removing the common source semiconductor material layer 110m deposited on the exposed sidewall of the word line cut opening 180H and the upper interlayer insulating layer 165. Thereafter, the common source line 103n may be formed by removing the spacer 185 and injecting impurities at a relatively high concentration from the upper surface of the substrate 101 to a predetermined depth.

Figure 7I:
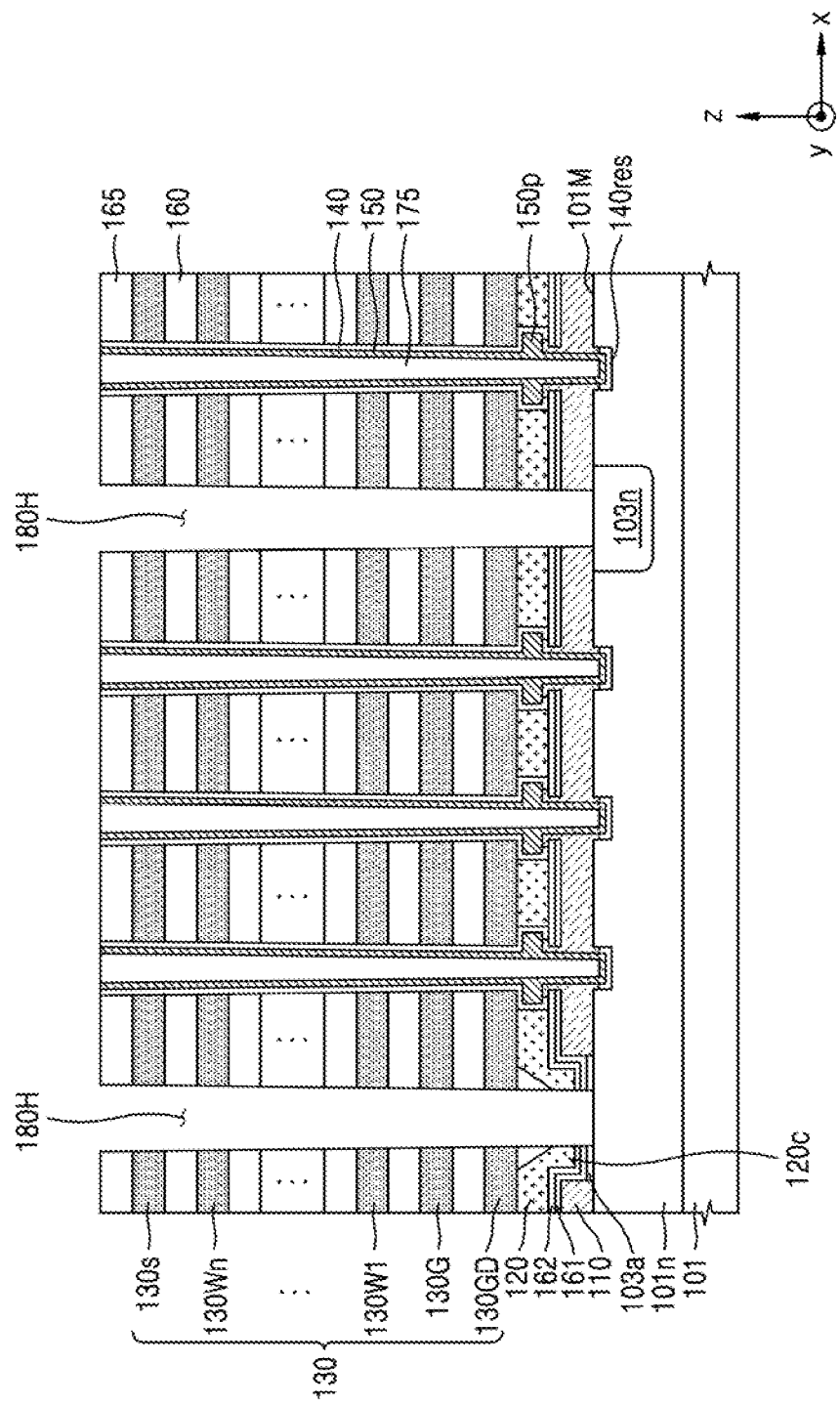

Referring to FIG. 7I, the sacrificial layers 130h may be replaced with the gate electrode 130. The sacrificial layers 130h may be selectively removed because the sacrificial layers 130h have etch selectivity with respect to the interlayer insulating layer 160 and the upper interlayer insulating layer 165. Thereafter, the gate electrode 130 may be formed by forming a conductive material constituting the gate electrode 130 by, e.g., CVD or ALD, at a position where the sacrificial layers 130h are removed.

Referring back to FIG. 2, the isolation region 180 including the conductive layer 182, the barrier layer 186, and the insulating spacer 184 may be formed in the word line cut opening 180H. Specifically, the insulating spacer 184 may be formed in the word line cut opening 180H, and then the barrier layer 186 and the conductive layer 182 may be formed. The conductive layer 182, the barrier layer 186, and the insulating spacer 184 may be formed by using, e.g., CVD, ALD, or the like, and specific materials thereof are described above, and thus detailed descriptions thereof will be omitted.

Subsequently, the conductive capping layer 177, which is electrically conductive, may be formed by partially removing upper ends of the information storage layer 140, the channel pattern 150, and the buried insulating layer 175. Thereafter, the upper interlayer insulating layer 192 may be formed and the contact plug 195 passing through the upper interlayer insulating layer 192 and extending in a vertical direction (z-direction) may be formed and then a bit line 193 which is electrically conductive and connected to the contact plug 195 may be formed. The contact plug 195 and the bit line 193 may include at least one of a metal (e.g., tungsten, titanium, tantalum, copper or aluminum), and a conductive metal nitride (e.g., TiN or TaN).

FIGS. 15A to 15F are lateral cross-sectional views showing stages in a method of fabricating the semiconductor device 100A, according to another embodiment. FIG. 16 is a partially enlarged view showing in detail the region B of FIG. 15A. Operations corresponding to FIGS. 7A to 7C are common, and thus redundant descriptions are omitted.

Figure 15A:
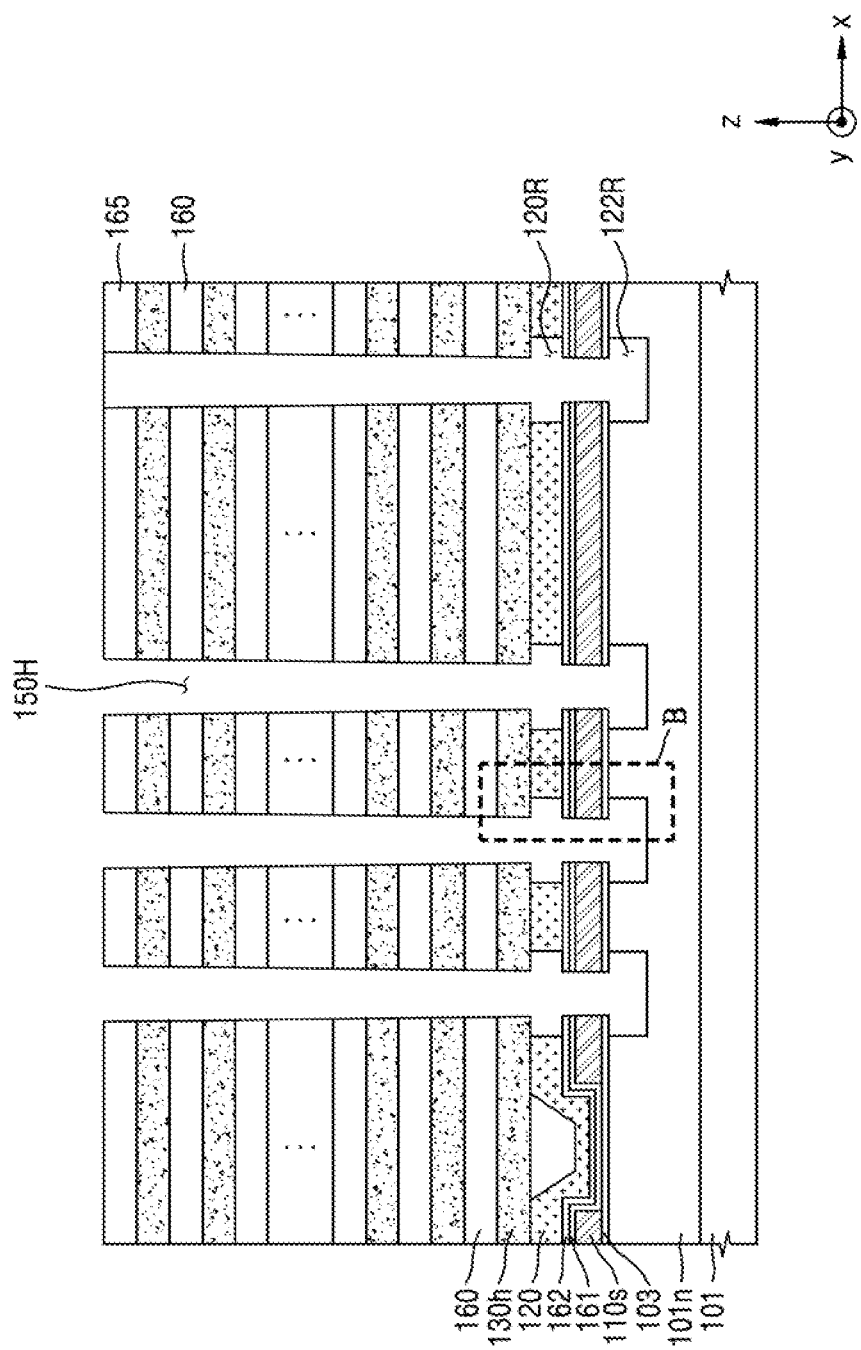
FIGS. 15A to 15F illustrate lateral cross-sectional views of stages in a method of fabricating a semiconductor device, according to an embodiment.
Figure 16:
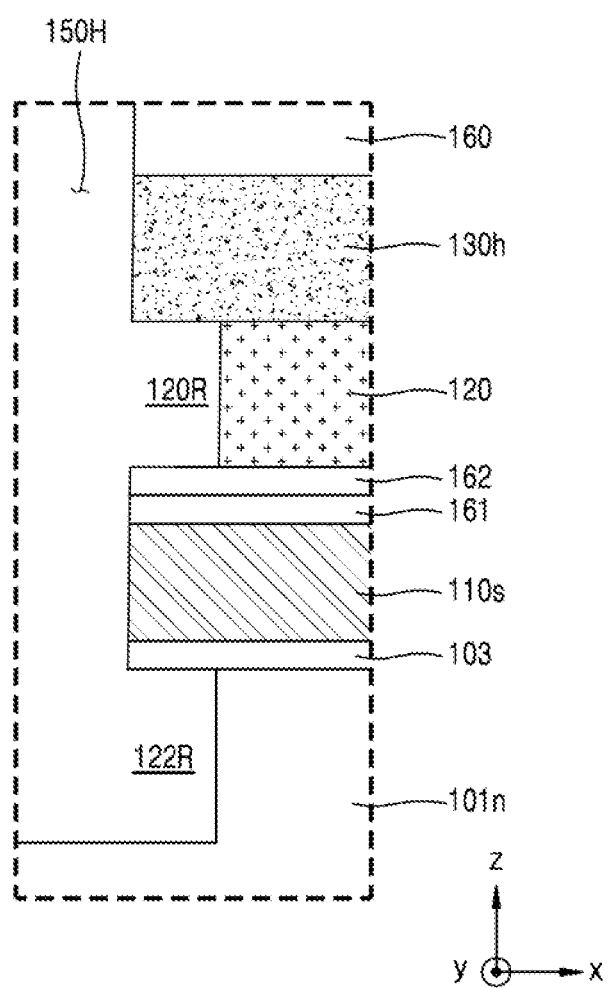
FIGS. 16 to 18 illustrate enlarged views of region B in FIGS. 15A to 15C.

Referring to FIGS. 15A and 16, the channel hole 150H that sequentially passes through the sacrificial layers 130h and the interlayer insulating layers 160, the support layer material layer 120A, the support insulating layer 162, the protection layer 161, the lower sacrificial layer pattern 110s, and the protection insulating layer 103 may be formed. The channel hole 150H may be formed by anisotropic etching.

Subsequently, the support layer 120 and the support layer recess 120R may be formed by partially removing the support layer material layer 120A to retreat, e.g., position farther away, the sidewall of the support layer material layer 120A. The sidewall of the support layer 120 may be retreated, e.g., offset, from the sidewall of the channel hole 150H thereabove. The sidewall of the support layer 120 may be further retreated, e.g., offset, from a sidewall of the sacrificial layer 130h positioned directly on the support layer 120.

In addition, the substrate 101 may be a polycrystalline silicon substrate. In this case, when the sidewall of the support layer material layer 120A is retreated, e.g., offset, the substrate 101 may be also partially removed to form the lower recess 122R. In some embodiments, a distance at which the support layer recess 120R is recessed in the horizontal direction and a distance at which the lower recess 122R is recessed in the horizontal direction may be substantially the same.

Figure 15B:
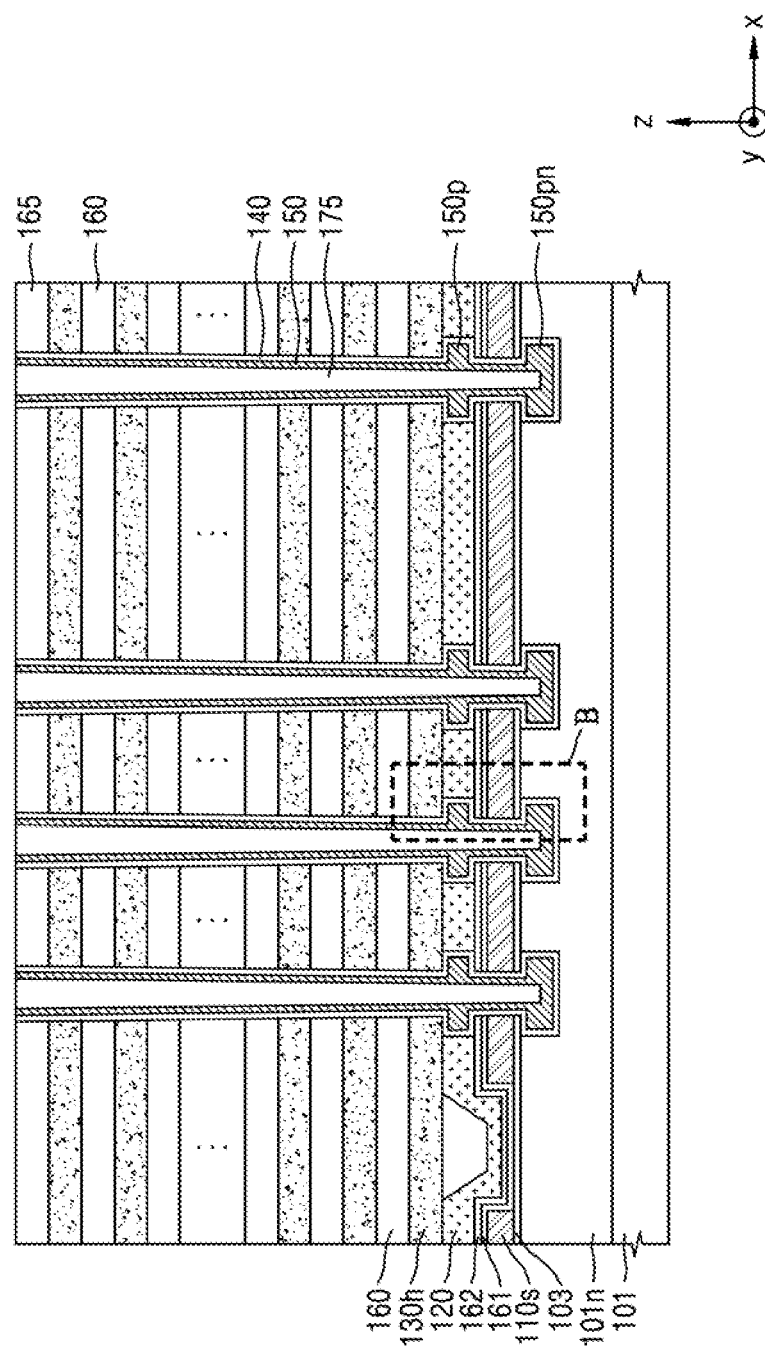
Figure 17:
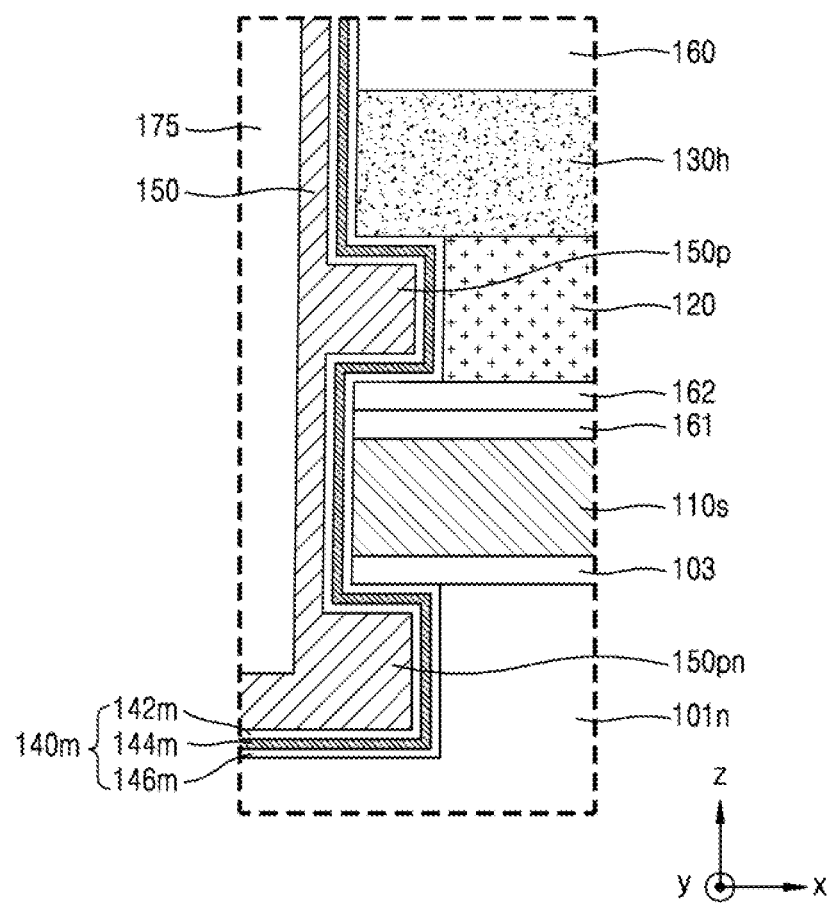

FIG. 17 is a partially enlarged view illustrating in detail the region B of FIG. 15B.

Referring to FIGS. 15B and 17, the information storage material layer 140m may be substantially conformally formed on an exposed inner surface of the channel hole 150H. Specifically, a blocking dielectric material layer 146m, a charge storage material layer 144m, and a tunneling dielectric material layer 142m may be formed sequentially and conformally from the side wall of the channel hole 150H, and may be formed by using, e.g., ALD.

Also, the channel pattern 150 and the buried insulating layer 175 may be formed on an inner surface of the tunneling dielectric material layer 142m. The channel pattern 150 may be formed to bury the support layer recess 120R such that the channel pattern extension portion 150p may be formed. In addition, the channel pattern 150 may be formed to bury the lower recess 122R such that the lower extension portion 150pn may be formed.

The information storage material layer 140m, the channel pattern 150, and the buried insulating layer 175 are described in detail with reference to FIG. 9. Thus, additional descriptions thereof will be omitted.

Figure 15C:
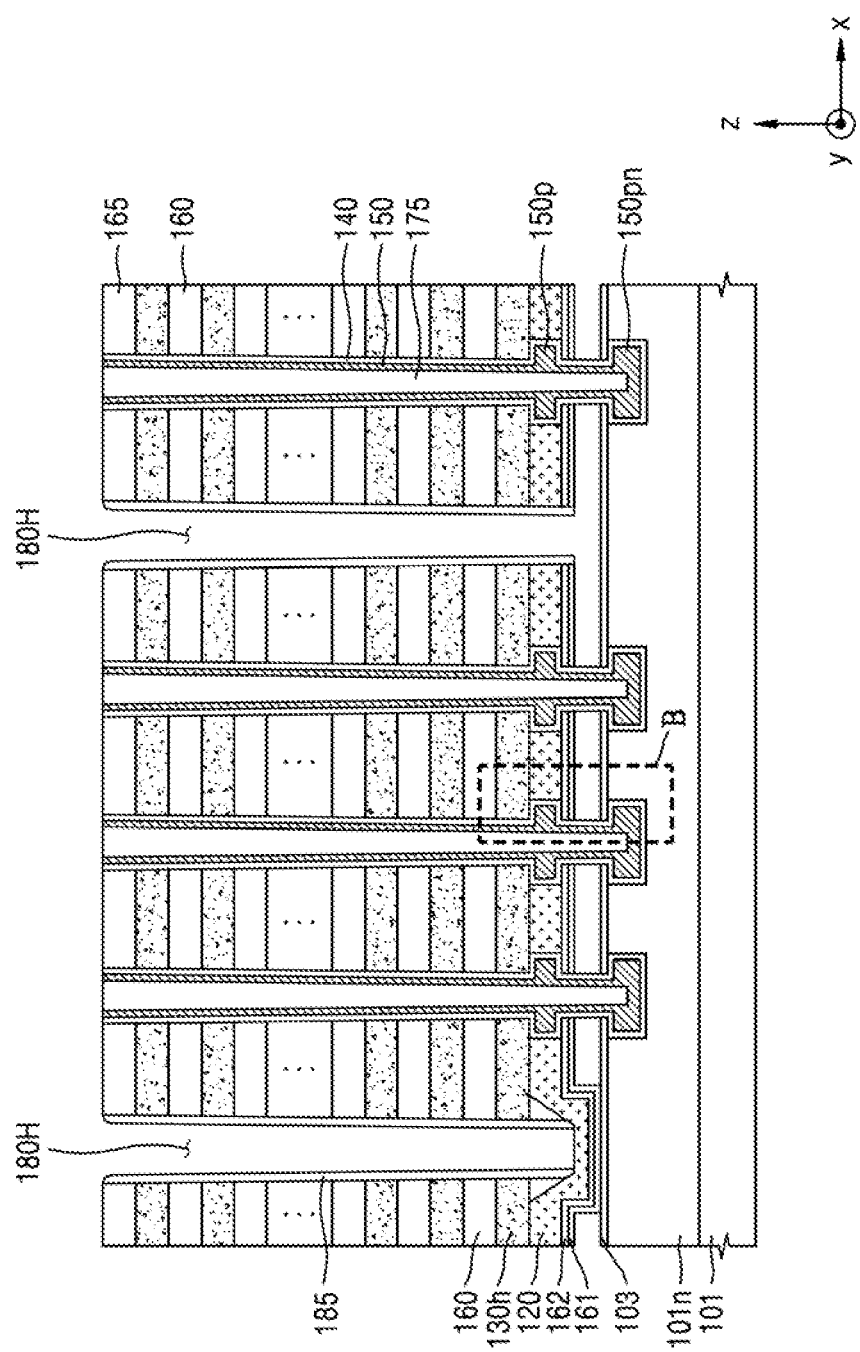
Figure 18:
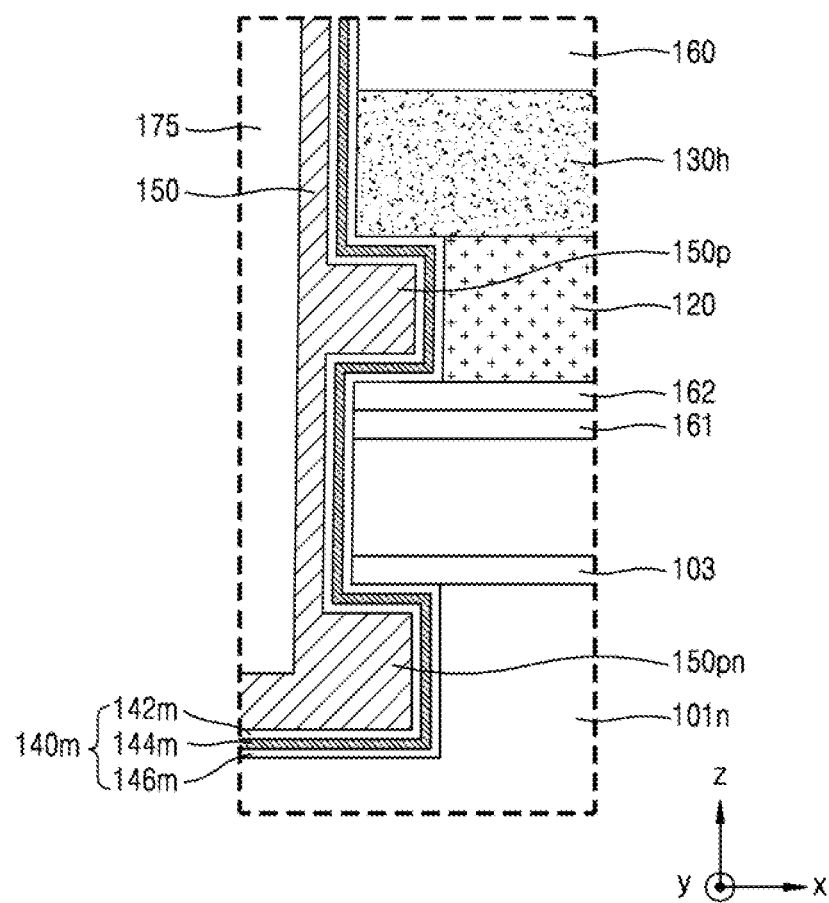

FIG. 18 is a partially enlarged view showing in detail the region B of FIG. 15C.

Referring to FIGS. 15C and 18, a mask pattern may be formed on the upper interlayer insulating layer 165, the word line cut opening 180H may be formed using the mask pattern as an etching mask, the spacer 185 may be formed, and then the lower sacrificial layer pattern 110s may be removed by selective etching.

Figure 15D:
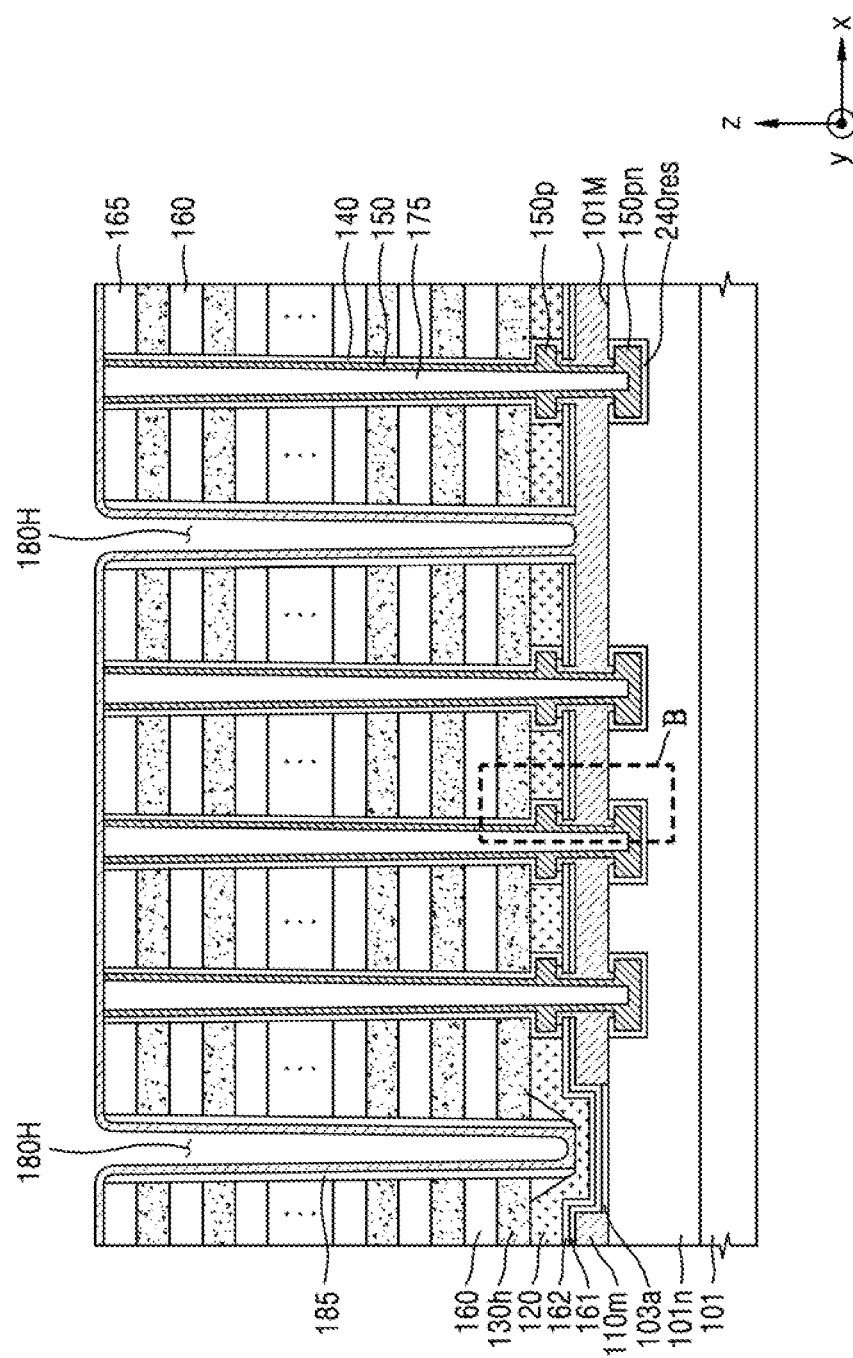
Figure 19:
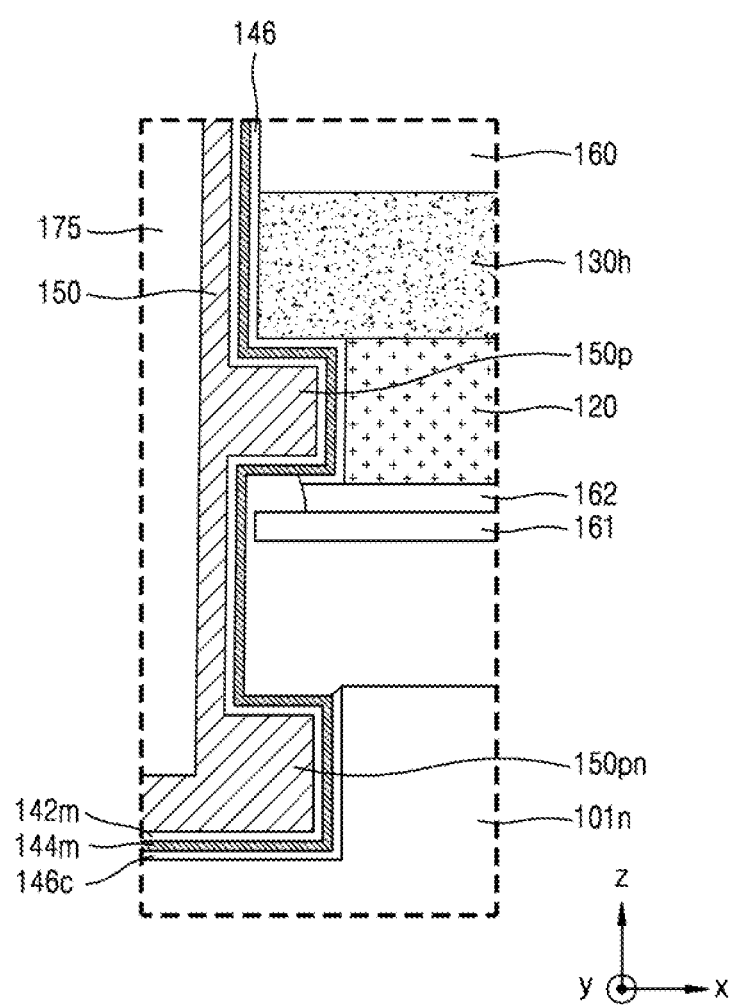
FIGS. 19 to 21 illustrate lateral cross-sectional views of stages in a method of removing an exposed part of an information storage material layer.
Figure 20:
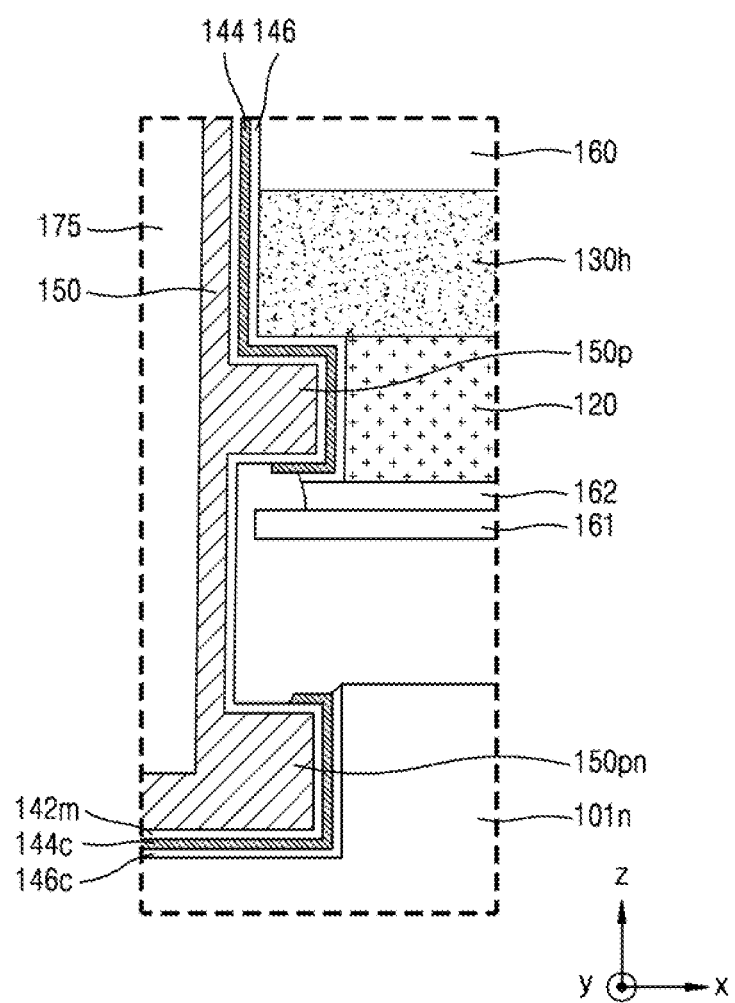
Figure 21:
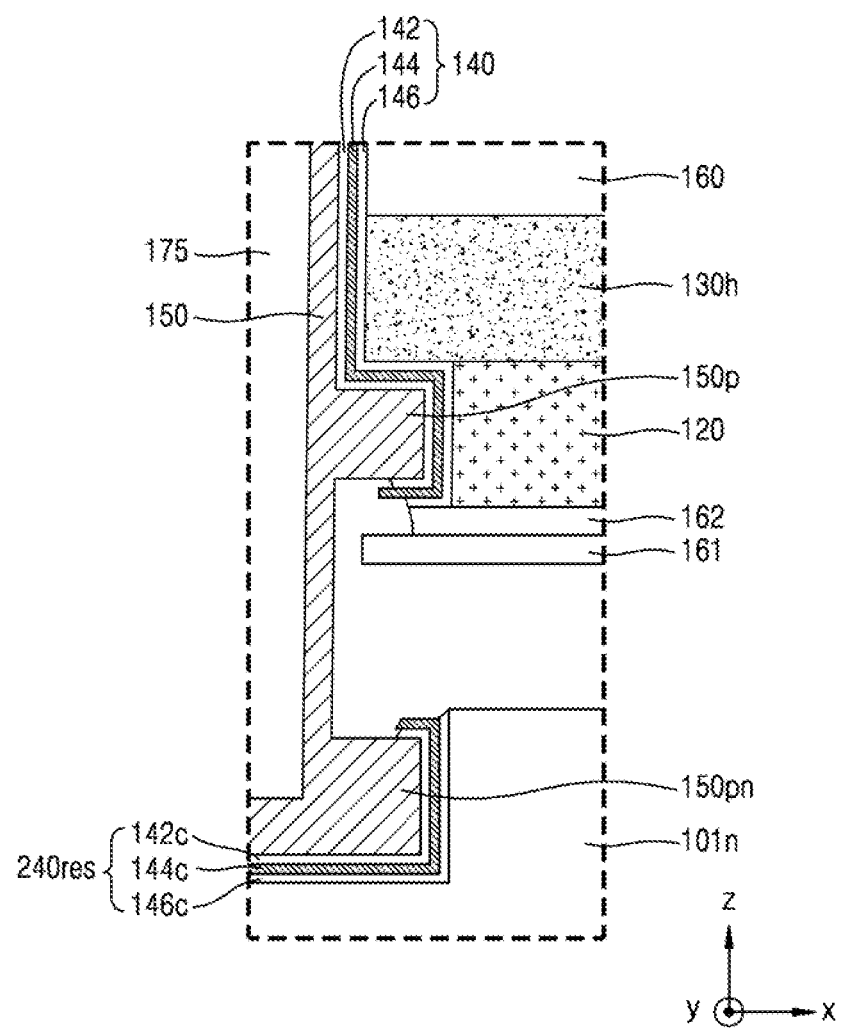

FIGS. 19 to 21 are lateral cross-sectional views showing a method of removing an exposed part of the information storage material layer 140m which may correspond to the region B of FIG. 15D.

Referring to FIG. 19, an exposed part of the blocking dielectric material layer 146m may be removed by isotropic etching. The blocking dielectric layer 146 and a residual blocking dielectric layer 146c may be formed by partially removing the blocking dielectric material layer 146m. In this case, when the support insulating layer 162 has an etching characteristic similar to that of the blocking dielectric material layer 146m, the support insulating layer 162 may be partially removed together with the blocking dielectric material layer 146m.

In addition, when the protection insulating layer 103 has an etching characteristic similar to that of the blocking dielectric material layer 146m, the protection insulating layer 103 may be removed together with the blocking dielectric material layer 146m. In addition, when the protection insulating layer 103 is removed, the blocking dielectric material layer 146m covering an upper surface of the lower extension portion 150pn may be entirely exposed by isotropic etching. In this case, most of a horizontal extension part of the blocking dielectric material layer 146m extending in a horizontal direction (x-direction, y-direction, or a combination thereof) along the upper surface of the lower extension portion 150pn may be removed.

Referring to FIG. 20, an exposed part of the charge storage material layer 144m may be removed by isotropic etching. The charge storage layer 144 and the residual charge storage layer 144c may be formed by partially removing the charge storage material layer 144m.

Referring to FIG. 21, an exposed part of the tunneling dielectric material layer 142m may be removed by isotropic etching. The tunneling dielectric layer 142 and the residual tunneling dielectric layer 142c may be formed by partially removing the tunneling dielectric material layer 142m.

Figure 22:
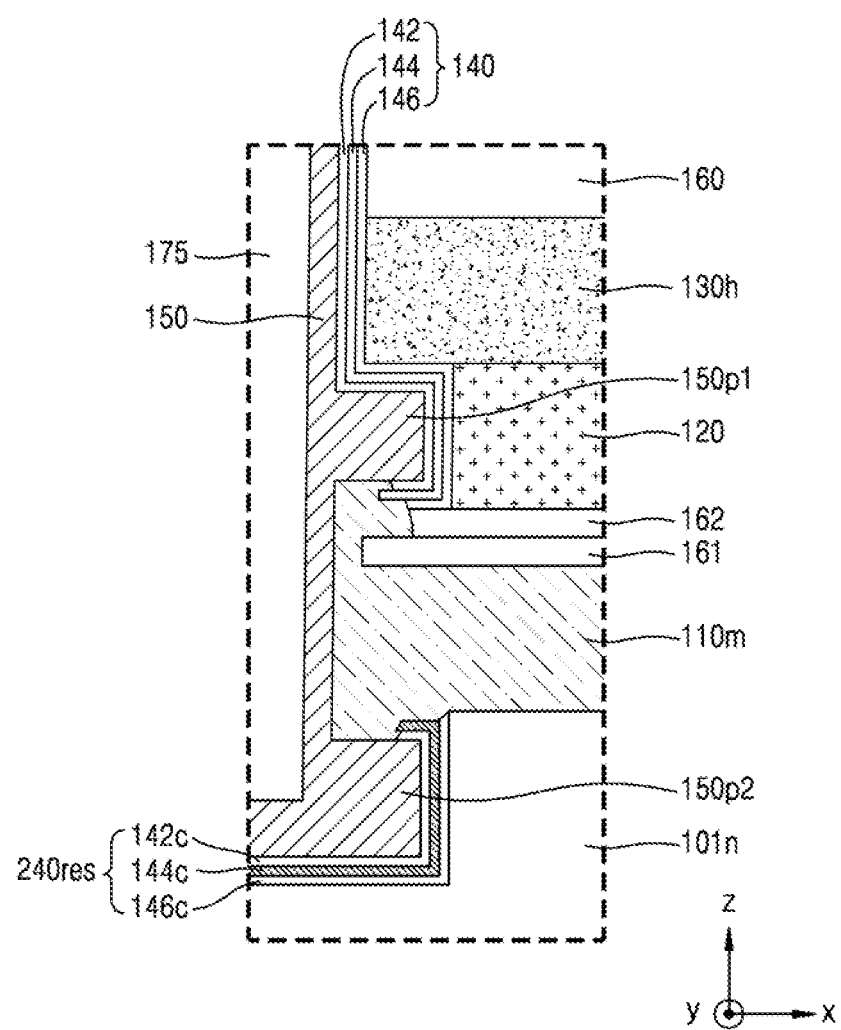
FIG. 22 illustrates an enlarged view of region B in FIG. 15D.

FIG. 22 is a partially enlarged view showing in detail the region B of FIG. 15D.

Referring to FIGS. 15D and 22, a common source semiconductor material layer 110m may be provided to bury a part where the lower sacrificial layer pattern 10s is removed and a part where the information storage material layer 140m is removed. The common source semiconductor material layer 110m may be deposited on a surface of an exposed sidewall (i.e., the spacer 185) of the word line cut opening 180H and on the upper interlayer insulating layer 165.

Figure 15E:
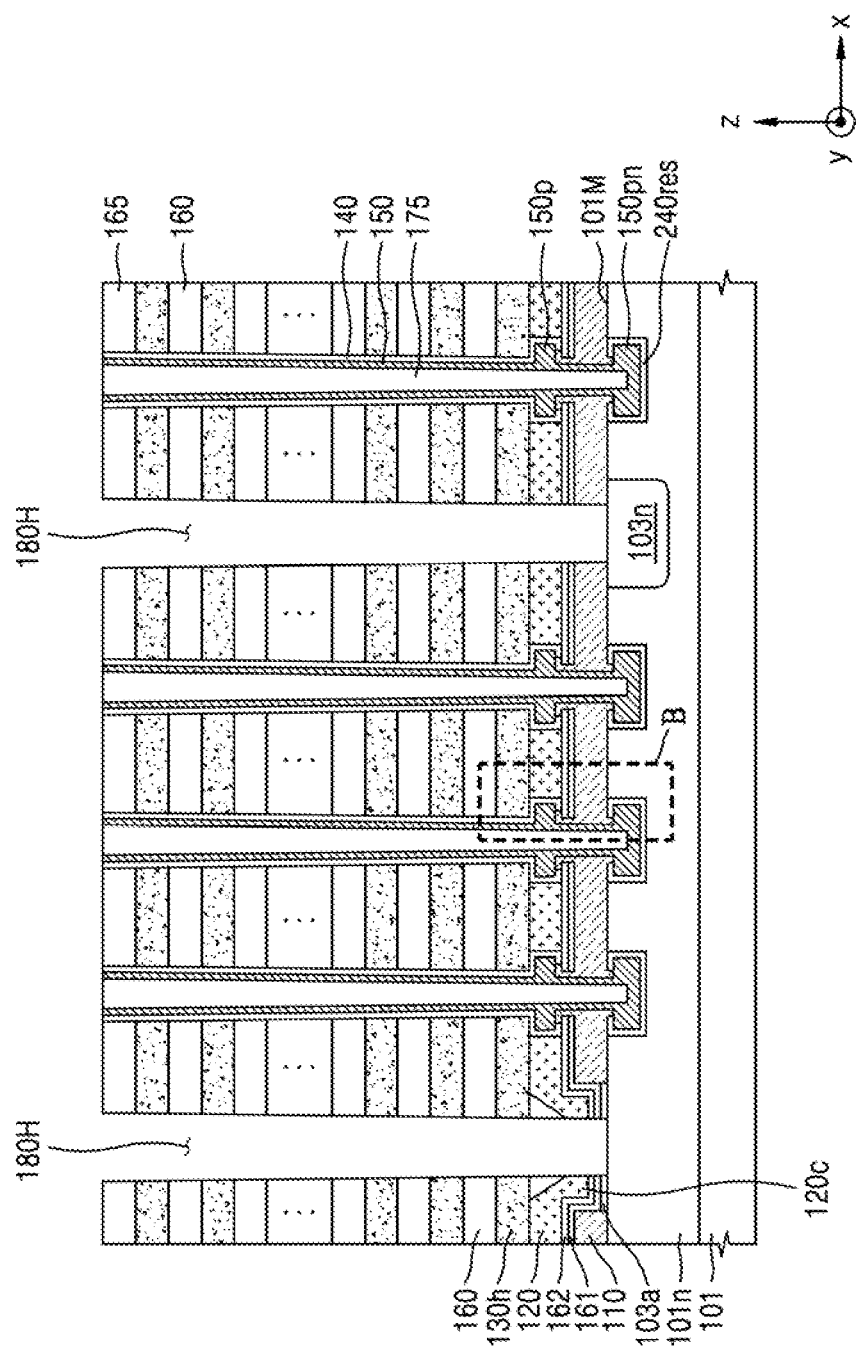

Referring to FIG. 15E, an upper surface of the substrate 101 may be exposed by removing the common source semiconductor material layer 110m deposited on the exposed sidewall of the word line cut opening 180H and the upper interlayer insulating layer 165. Thereafter, the common source line 103n may be formed by removing the spacer 185 and injecting impurities at a relatively high concentration from the upper surface of the substrate 101 to a predetermined depth.

Figure 15F:
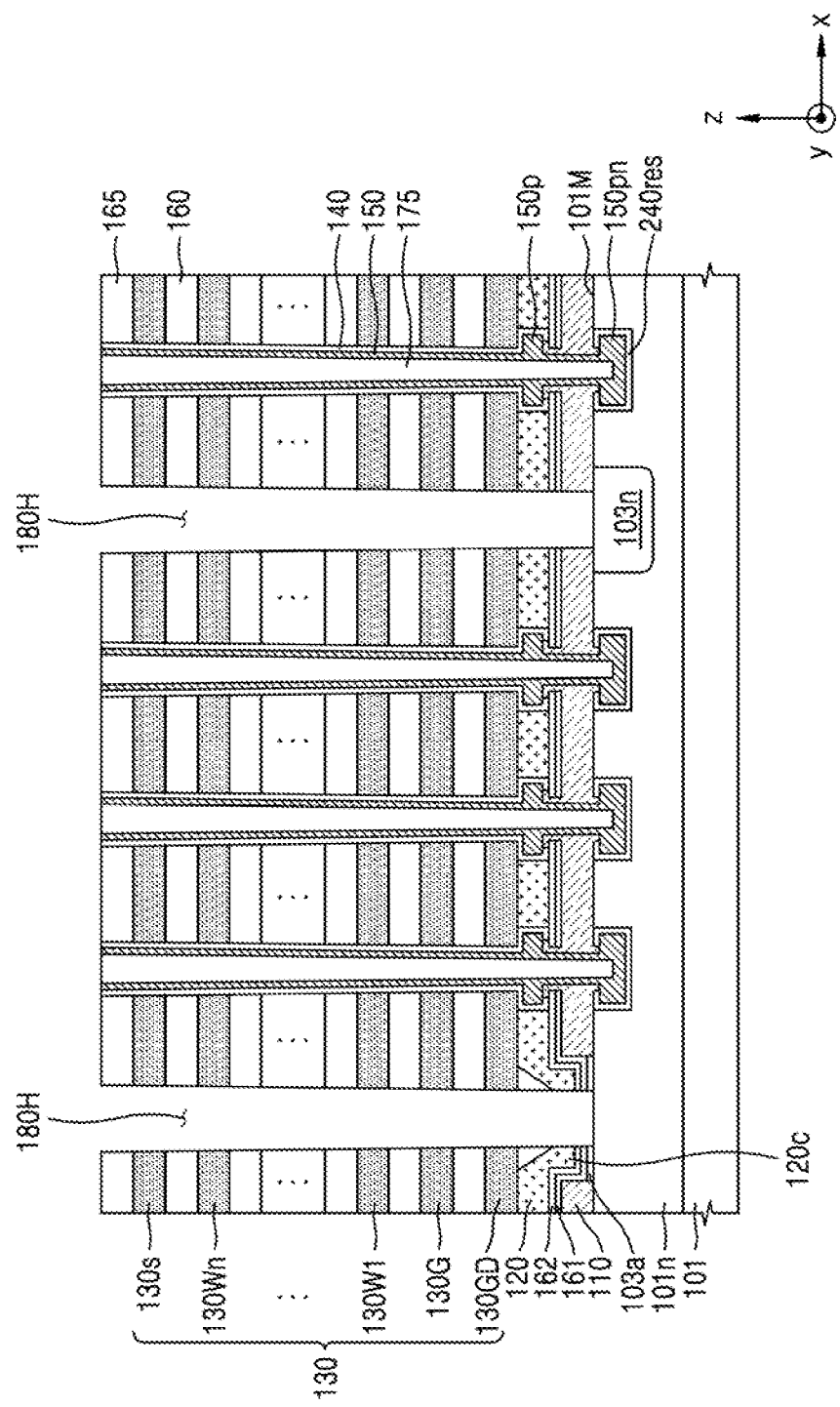

Referring to FIG. 15F, the sacrificial layers 130h may be replaced with the gate electrode 130. The sacrificial layers 130h may be selectively removed because the sacrificial layers 130h have etch selectivity with respect to the interlayer insulating layer 160 and the upper interlayer insulating layer 165. Thereafter, the gate electrode 130 may be formed by forming a conductive material constituting the gate electrode 130 by e.g., CVD or ALD, at a position where the sacrificial layers 130h are removed.

Referring to FIG. 5, the isolation region 180 including the conductive layer 182, the barrier layer 186, and the insulating spacer 184 may be formed in the word line cut opening 180H. Specifically, the insulating spacer 184 may be formed in the word line cut opening 180H and then the barrier layer 186 and the conductive layer 182 may be formed. The conductive layer 182, the barrier layer 186, and the insulating spacer 184 may be formed by, e.g., CVD, ALD, or the like, and specific materials thereof are described above, and thus detailed descriptions thereof will be omitted.

Subsequently, the conductive capping layer 177 may be formed by partially removing upper ends of the information storage layer 140, the channel pattern 150, and the buried insulating layer 175. Thereafter, the upper interlayer insulating layer 192, the contact plug 195, and the bit line 193 are formed, which are the same as described with reference to FIG. 2, and thus detailed descriptions thereof will be omitted.

Figure 23:
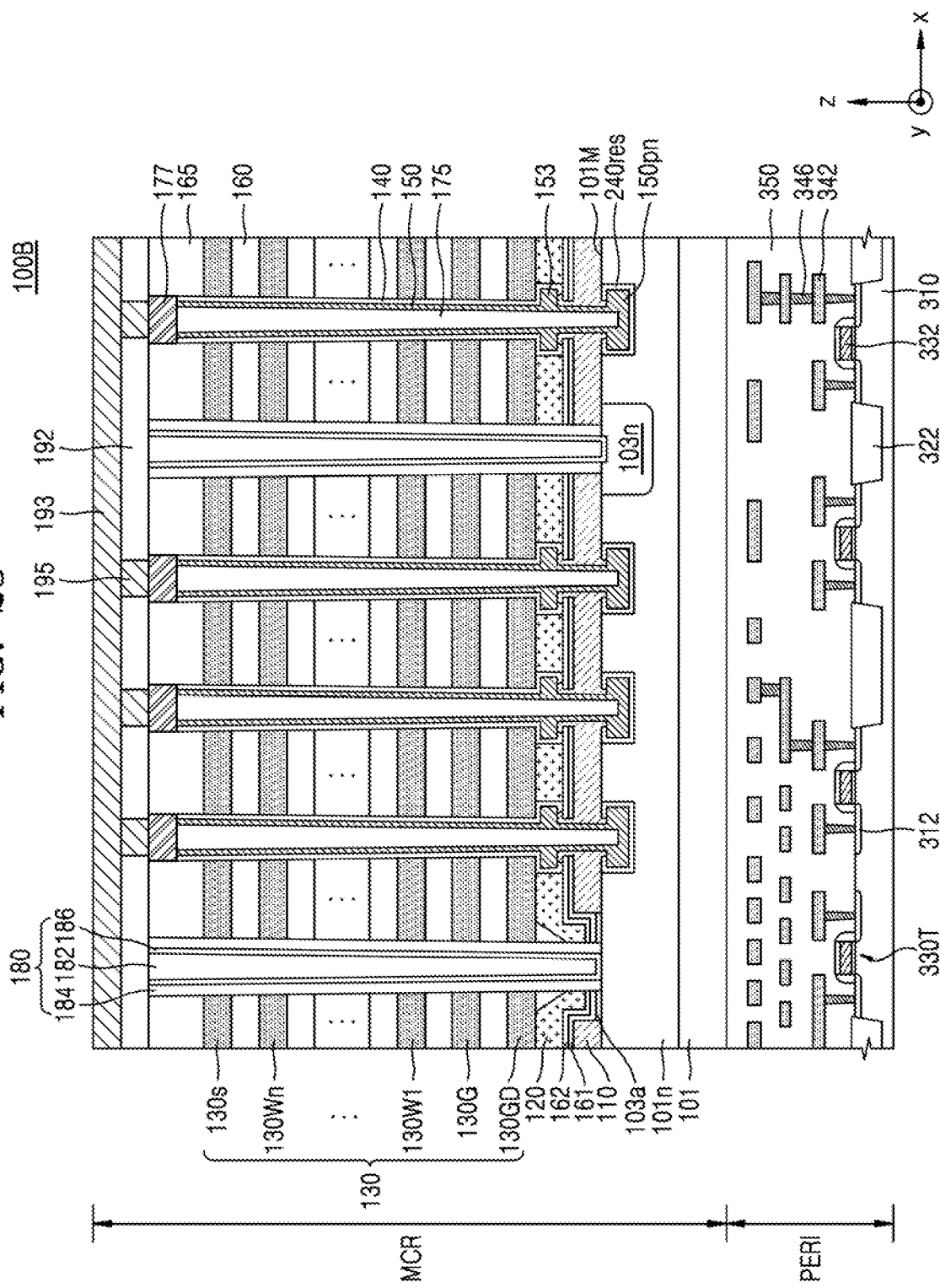
FIG. 23 illustrates a cross-sectional view of a semiconductor device according to embodiments.

FIG. 23 is a cross-sectional view illustrating a semiconductor device 100B according to embodiments. In FIG. 23, the same reference numerals as in FIGS. 1 to 22 denote the same components.

Referring to FIG. 23, a peripheral circuit region PERI may be formed at a lower vertical level than the memory cell region MCR. A lower substrate 310 may be disposed at a lower vertical level than the substrate 101, and an upper level of the lower substrate 310 may be lower than an upper level of the substrate 101. An active region may be defined in the lower substrate 310 by a device isolation layer 322, and a plurality of driving transistors 330T may be formed on the active region. The plurality of driving transistors 330T may include a driving circuit gate structure 332 and an impurity region 312 disposed in a part of the lower substrate 310 on both sides of the driving circuit gate structure 332.

A plurality of wiring layers 342, a plurality of contact plugs 346, and a lower interlayer insulating layer 350 may be disposed on the lower substrate 310. The plurality of contact plugs 346 may connect between the plurality of wiring layers 342 or between the plurality of wiring layers 342 and the driving transistors 330T. In addition, the lower interlayer insulating layer 350 may cover the plurality of wiring layers 342 and the plurality of contact plugs 246.

Because the substrate 101 needs to be formed on the lower interlayer insulating layer 350, the substrate 101 may include polysilicon instead of single crystal silicon. As described above with reference to FIGS. 15A and 16, when the substrate 101 is polysilicon, the lower recess 122R may be formed together when the support layer recess 120R is formed. As a result, the lower extension portion 150pn may be formed at a lower end of the channel pattern 150.

According to embodiments, a vertical semiconductor device having excellent electrical characteristics and high reliability, as well as a method of manufacturing thereof, is provided. That is, a vertical semiconductor device having excellent electrical characteristics, e.g., a GIDL erase, and high reliability may be fabricated relatively easily.

In other words, according to embodiments, after formation of a channel hole, a support layer recess is formed by enlarging a sidewall of a support layer, and a space is filled with ONO and a channel pattern. When ONO isotropic etching is performed to form an ONO butting contact, an ONO end part is limited at a lower portion of the channel pattern extension portion. As a result, a distance between a gate of a GIDL transistor and a common source semiconductor layer may be maintained constant, and a region in which the gate of the GIDL transistor and the channel pattern overlap increases. The channel pattern extension portion also facilitates diffusion control, thereby improving GIDL efficiency and reducing leakage of a ground selection transistor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical semiconductor layer, comprising:
    a common source semiconductor layer on a substrate;
    a support layer on the common source semiconductor layer;
    gates and interlayer insulating layers alternately stacked on the support layer;
    a channel pattern extending in a first direction perpendicular to an upper surface of the substrate while penetrating the gates, and the support layer, and a sidewall of the support layer facing the channel pattern being offset relative to sidewalls of the gates facing the channel pattern; and
    an information storage layer extending between the gates and the channel pattern, the information storage layer extending at least to the sidewall of the support layer facing the channel pattern,
    wherein the common source semiconductor layer contacts a sidewall of the channel pattern, wherein the channel pattern includes a channel pattern extension portion protruding toward the support layer in a lateral direction of the support layer, wherein the channel pattern extension portion extends in a second direction perpendicular to the first direction, and wherein a thickness of the channel pattern extension portion in the first direction is two times or more a thickness of the channel pattern at lateral sides of the gates along the second direction.

2. The vertical semiconductor layer as claimed in claim 1, further comprising a support insulating layer and a protection layer between the common source semiconductor layer and the support layer, the protection layer protecting the support insulating layer.

3. The vertical semiconductor layer as claimed in claim 2, wherein the information storage layer extends to at least the support insulating layer.

4. The vertical semiconductor layer as claimed in claim 3, wherein the information storage layer includes a horizontal extension portion extending in a horizontal direction along an upper surface of the support insulating layer.

5. The vertical semiconductor layer as claimed in claim 1, wherein the substrate has a p-conductivity type and includes an n-well in a lower portion of the common source semiconductor layer.

6. The vertical semiconductor layer as claimed in claim 1, wherein the common source semiconductor layer is in contact with an end of the information storage layer.

7. The vertical semiconductor layer as claimed in claim 1, wherein the substrate includes a polycrystalline silicon substrate.

8. The vertical semiconductor layer as claimed in claim 7, wherein the channel pattern includes a horizontal extension portion extending in a horizontal direction under the common source semiconductor layer.

9. The vertical semiconductor layer as claimed in claim 7, further comprising a lower substrate under the substrate and a peripheral circuit region between the substrate and the lower substrate.

10. A vertical semiconductor layer, comprising:
a common source semiconductor layer on an n-well of a substrate;
a support layer on the common source semiconductor layer;
gates and interlayer insulating layers alternately stacked on the support layer;
a channel pattern extending in a first direction perpendicular to an upper surface of the substrate while penetrating the gates and the support layer, the channel pattern including a channel pattern extension portion protruding toward the support layer in a lateral direction of the support layer, and a sidewall of the support layer facing the channel pattern being offset relative to sidewalls of the gates facing the channel pattern; and
an information storage layer extending between the gates and the channel pattern,
wherein the common source semiconductor layer contacts a sidewall of the channel pattern and does not contact a bottom of the channel pattern, and
wherein a thickness of the channel pattern extension portion in the first direction is two or more times a thickness of the channel pattern at sides of the gates.

11. The vertical semiconductor layer as claimed in claim 10, further comprising:
a channel hole, the channel pattern extending through the channel hole, and a portion of the channel pattern extending in the first direction being integral with the channel pattern extension portion; and
a conductive capping layer contacting the channel pattern on an upper portion of the channel hole.

12. The vertical semiconductor layer as claimed in claim 10, wherein the information storage layer extends to a sidewall of the support layer along a lower surface of a gate nearest the support layer.

13. The vertical semiconductor layer as claimed in claim 12, wherein the information storage layer includes a vertical extension portion extending in a vertical direction along the sidewall of the support layer.

14. The vertical semiconductor layer as claimed in claim 12, wherein:
the information storage layer includes a tunneling dielectric layer, a charge storage layer, and a blocking dielectric layer, and
positions of end portions of the tunneling dielectric layer and the blocking dielectric layer are different from each other in an extension direction of the information storage layer.

15. The vertical semiconductor layer as claimed in claim 10, wherein a level of an uppermost end of the common source semiconductor layer in the first direction is equal to or lower than a level of a lower surface of the channel pattern extension portion.

16. A vertical semiconductor layer, comprising:
a common source semiconductor layer on an n-well of a substrate having a p-conductivity type;
a support layer on the common source semiconductor layer;
gates and interlayer insulating layers alternately stacked on the support layer;
a channel pattern extending in a first direction perpendicular to an upper surface of the substrate while penetrating the gates and the support layer, the channel pattern extending through a channel hole, and the support layer being in direct contact with a lowermost gate of the gates in the channel hole; and
an information storage layer extending between the gates and the channel pattern,
wherein a sidewall of the support layer facing the channel hole is offset relative to sidewalls of the gates facing the channel hole, and
wherein the information storage layer extends horizontally toward the support layer along a lower surface of the lowermost gate of the gates and then extends in the first direction along the sidewall of the support layer,
wherein the common source semiconductor layer contacts a sidewall of the channel pattern,
wherein the channel pattern includes a channel pattern extension portion protruding toward the support layer in a lateral direction of the support layer,
wherein the channel pattern extension portion extends in a second direction perpendicular to the first direction, and
wherein a thickness of the channel pattern extension portion in the first direction is two times or more a thickness of the channel pattern at lateral sides of the gates along the second direction.

* * * * *